United States Patent
Maniyara et al.

(10) Patent No.: US 12,351,899 B2
(45) Date of Patent: Jul. 8, 2025

(54) TRANSPARENT ARTICLE WITH A BODY AND METAL OXIDE DISPOSED DIRECTLY ON THE BODY, FACILITATING DEPOSITION OF AN ELECTRICALLY CONDUCTIVE AND TRANSPARENT ULTRA-THIN METAL FILM OF A NOBLE METAL, AND METHOD OF FORMING THE SAME

(71) Applicants: CORNING INCORPORATED, Corning, NY (US); Fundació Institut de Ciències Fotòniques (ICFO), Castelldefelts (ES); Institució Catalana de Recercai i Estudis Avançats, Barcelona (ES)

(72) Inventors: Rinu Abraham Maniyara, State College, PA (US); Daniel Martínez Cercós, Barcelona (ES); Prantik Mazumder, Ithaca, NY (US); Bruno Paulillo, Castelldefels (ES); Valerio Pruneri, Castelldefels (ES)

(73) Assignees: CORNING INCORPORATED, Corning, NY (US); FUNDACIÓ INSTITUT DE CIENCIES FOTÒNIQUES, Castelldefels (ES); INSTITUCIÓ CATALANA DE RECERCA I ESTUDIS AVANATS (ICREA), Barcelona (ES)

( * ) Notice: Subject to any disclaimer, the term of this patent is extended or adjusted under 35 U.S.C. 154(b) by 464 days.

(21) Appl. No.: 17/752,958

(22) Filed: May 25, 2022

(65) Prior Publication Data
US 2022/0380882 A1 Dec. 1, 2022

Related U.S. Application Data

(60) Provisional application No. 63/194,286, filed on May 28, 2021.

(51) Int. Cl.
| | | |
|---|---|---|
| H01B 5/14 | (2006.01) | |
| C23C 14/08 | (2006.01) | |
| C23C 14/18 | (2006.01) | |
| C23C 14/35 | (2006.01) | |
| G01N 21/31 | (2006.01) | |

(52) U.S. Cl.
CPC .......... *C23C 14/087* (2013.01); *C23C 14/185* (2013.01); *C23C 14/35* (2013.01); *G01N 21/31* (2013.01); *H01B 5/14* (2013.01)

(58) Field of Classification Search
None
See application file for complete search history.

(56) References Cited

U.S. PATENT DOCUMENTS

| | | | |
|---|---|---|---|
| 5,566,672 A * | 10/1996 | Faasse, Jr. | A61N 1/0456 607/152 |
| 9,519,209 B2 | 12/2016 | Pruneri et al. | |
| 2012/0125660 A1 | 5/2012 | Bright | |
| 2017/0025555 A1 * | 1/2017 | Zhu | H01B 1/08 |
| 2017/0200526 A1 | 7/2017 | Guo et al. | |
| 2017/0229668 A1 * | 8/2017 | Stapleton | H10K 71/60 |
| 2018/0157160 A1 | 6/2018 | Pruneri et al. | |
| 2019/0006450 A1 * | 1/2019 | Lee | H01L 21/0228 |

FOREIGN PATENT DOCUMENTS

| | | |
|---|---|---|
| CN | 107077906 B | 8/2020 |
| EP | 2133921 A1 | 12/2009 |
| EP | 2973728 B1 | 7/2019 |
| JP | 4961786 B2 | 6/2012 |
| KR | 10-2017-0076787 A | 7/2017 |
| WO | 2014/140297 A1 | 9/2014 |

OTHER PUBLICATIONS

A. A. Ogwu, et al., "An investigation of the surface energy and optical transmittance of copper oxide thin films prepared by reactive magnetron sputtering," Acta Mater., vol. 53, No. 19, 2005, pp. 5151-5159.
A. Milewska, et al., "Herding cats: managing gold atoms on common transparent dielectrics [Invited]," Opt. Mater. Express, vol. 9, No. 1, 2019, pp. 112-119.
D. I. Yakubovsky et al., "Ultrathin and Ultrasmooth Gold Films on Monolayer MoS2," Adv. Mater. Interfaces, vol. 6, No. 13, 2019.
D. S. Ghosh, et al., "Widely transparent electrodes based on ultrathin metals," Opt. Lett., 2009, vol. 34 No. 03, pp. 325-327.
E. Jeong, et al., "Minimizing optical loss in ultrathin Ag films based on Ge wetting layer?: Insights on Ge-mediated Ag growth," Applied Surface Science, vol. 528, Apr. 2020.
K. Leosson, et al., "Ultra-thin gold films on transparent polymers," Nanophotonics, vol. 2, No. 1, 2013, pp. 3-11.
K. M. McPeak et al., "Plasmonic films can easily be better: Rules and recipes," ACS Photonics, vol. 2, No. 3, 2015, pp. 326-333.

(Continued)

*Primary Examiner* — Sheeba Ahmed

(57) ABSTRACT

An article comprising: (i) a body, the body comprising a material and a transmittance greater than or equal to 90% throughout an electromagnetic radiation wavelength range of 250 nm to 800 nm; and (ii) cupric oxide (CuO) in direct contact with the material of the body, the cupric oxide (CuO) comprising a thickness that is less than or equal to 1.3 nm. Also disclosed is the article further comprising: an ultra-thin metal film disposed directly on the cupric oxide (CuO). The article demonstrates a transmittance greater than or equal to 65% throughout an electromagnetic radiation wavelength range of 300 nm to 1400 nm. The ultra-thin metal film can be silver (Ag), gold (Au), copper (Cu), or platinum (Pt). The ultra-thin metal film comprises a thickness within a range of 1 nm to 5 nm. The article at the ultra-thin metal film has a sheet resistance of less than or equal to 2100 Ω/□. Additionally, a method of forming the article.

29 Claims, 19 Drawing Sheets

(56) References Cited

OTHER PUBLICATIONS

L. Leandro, et al., "Ultrathin, Ultrasmooth Gold Layer on Dielectrics without the Use of Additional Metallic Adhesion Layers," ACS Appl. Mater. Interfaces, vol. 7, No. 10, 2015, pp. 5797-5802.
N. Formica, et al., "Ultrastable and atomically smooth ultrathin silver films grown on a copper seed layer," ACS Appl. Mater. Interfaces, vol. 5, No. 8, 2013, pp. 3048-3053.
N. Luhmann et al., "Ultrathin 2 nm gold as impedance-matched absorber for infrared light," Nat. Commun., 2020.
R. A. Maniyara et al., "Tunable plasmons in ultrathin metal films," Nat. Photonics, vol. 13, No. 5, 2019, pp. 328-333.
R. A. Maniyara, et al., "An antireflection transparent conductor with ultralow optical loss (<2 %) and electrical resistance (⁢6?O? sq-1)," Nat. Commun., vol. 7, 2013, pp. 13771.
R. Henriquez et al., "Effect of a metallic surfactant on the electrical percolation of gold films," Appl. Surf. Sci., vol. 489, No. Nov. 2018, 2019, pp. 403-408.
R. Lemasters et al., "Ultrathin Wetting Layer-Free Plasmonic Gold Films," ACS Photonics, 2019.
S. Felix, et al., "Microwave assisted synthesis of copper oxide and its application in electrochemical sensing," IOP Conf. Ser. Mater. Sci. Eng., vol. 73, No. 1, 2015, pp. 8-13.
S. Foteinopoulou, et al., "Feature issue introduction: Beyond Thin Films: Photonics with Ultrathin and Atomically Thin Materials," Opt. Mater. Express, vol. 9, No. 5, 2019, p. 2427.
T. Ghosh and B. Satpati, "Role of oxygen in wetting of copper nanoparticles on silicon surfaces at elevated temperature," Beilstein J. Nanotechnol., vol. 8, No. 1, 2017, pp. 425-433.
T. Velusamy et al., "Ultra-small CuO nanoparticles with tailored energy-band diagram synthesized by a hybrid plasma-liquid process," Plasma Process. Polym., vol. 14, No. 7, 2017, pp. 1-8.
Y. G. Bi et al., "Ultrathin Metal Films as the Transparent Electrode in ITO-Free Organic Optoelectronic Devices," Adv. Opt. Mater., vol. 7, No. 6, 2019. pp. 1-23.
Z. M. Abd El-Fattah et al., "Plasmonics in Atomically Thin Crystalline Silver Films," ACS Nano, vol. 13, No. 7, 2019, pp. 7771-7779.

* cited by examiner

EXAMPLE 2

TRANSPARENT ARTICLE WITH A BODY AND METAL OXIDE DISPOSED DIRECTLY ON THE BODY, FACILITATING DEPOSITION OF AN ELECTRICALLY CONDUCTIVE AND TRANSPARENT ULTRA-THIN METAL FILM OF A NOBLE METAL, AND METHOD OF FORMING THE SAME

PRIORITY

This application claims the benefit of priority under 35 U.S.C. § 119 of U.S. Provisional Application No. 63/194,286, filed on May 28, 2021, the content of which is relied upon and incorporated herein by reference in its entirety.

BACKGROUND

Transparent conductors have wide application. Transparent conductive oxides, such as indium-tin oxide ("ITO"), are widely used transparent conductors. ITO is both electrically conductive and is highly transparent to electromagnetic radiation having a wavelength in the visible spectrum. However, use of ITO has a major drawback in that indium is relatively rare and expensive to procure. Known sources of indium will likely eventually be depleted. Thus, there is a general need for new transparent conductors that utilize more readily available source materials.

In addition, ITO presents other manufacturing and performance related drawbacks. For example, ITO is difficult to apply to a body, typically leaving surface defects and vacancies that require post-deposition treatments. In addition, some applications for the transparent conductor, such as infrared pyroelectric detectors, require the transparent conductor to be transparent to electromagnetic radiation having a wavelength in the infrared region. ITO demonstrates plasma resonances in the near infrared region, which makes ITO impractical for use with those applications. Further, ITO has a certain brittleness rendering ITO unsuitable for certain applications, such as flexible articles.

Ultra-thin metal films ("UTMF") have been a focus of investigation as a possible replacement for ITO and transparent conductive oxides generally. For example, the Period IV transition metals chromium and nickel have been explored as alternatives to ITO. However, UTMFs of those metals (chromium and nickel) oxidize over time. The oxidization increases electrical resistance of the UTMF. The increase in electrical resistance denigrates the functionality of the application for which the UTMF is utilized.

Thus, there is interest in developing UTMFs that utilize metals that are less prone to oxidation, such as so called "noble metals"—including among them gold, silver, and copper. However, UTMFs of noble metals thus far have resulted in articles with insufficient transparency and electrical conductivity, insufficient adherence to the body, and a relatively rough surface morphology.

SUMMARY

The present disclosure addresses those issues by disposing a seed layer of cupric oxide (CuO) having a thickness less than or equal to 1.3 nm onto a body that is transparent. The seed layer of cupric oxide (CuO), being so thin, generally maintains the transparency of the body. The seed layer of cupric oxide (CuO) facilitates subsequent deposition of a UTMF of a noble metal having a thickness of 5 nm or less, or even 2 nm or less, with higher quality than if no seed layer of cupric oxide (CuO) was applied. The resulting article resists oxidation at the UTMF, has a low surface roughness at the UTMF, and is generally transparent to all wavelengths of electromagnetic radiation in the visible and infrared spectrums, as well as partially into the ultraviolet spectrum.

According to a first aspect of the disclosure, an article comprises: (i) a body, the body comprising a material and a transmittance greater than or equal to 90% throughout an electromagnetic radiation wavelength range of 250 nm to 800 nm, wherein the transmittance is measured utilizing one or more of a spectrophotometer and a spectrometer; and (ii) cupric oxide (CuO) in direct contact with the material of the body, the cupric oxide (CuO) comprising a thickness that is less than or equal to 1.3 nm.

According to a second aspect of the disclosure, the article of the first aspect, wherein the material of the body comprises calcium fluoride ($CaF_2$).

According to a third aspect of the disclosure, the article of any one of the first through second aspects, wherein the thickness of the cupric oxide (CuO) is less than or equal to 1.0 nm.

According to a fourth aspect of the disclosure, the article of any one of the first through third aspects, wherein the thickness of the cupric oxide (CuO) is within a range of 0.4 nm to 0.7 nm.

According to a fifth aspect of the disclosure, the article of any one of the first through fourth aspects, wherein the article is free of a layer of metallic copper (Cu) disposed between the cupric oxide (CuO) and the body.

According to a sixth aspect of the disclosure, the article of any one of the first through fifth aspects, wherein the article comprises a transmittance greater than or equal to 90% throughout an electromagnetic radiation wavelength range of 300 nm to 800 nm, wherein the transmittance is measured utilizing one or more of a spectrophotometer and a spectrometer.

According to a seventh aspect of the disclosure, the article of any one of the first through fifth aspects, wherein the article comprises a transmittance greater than or equal to 90% throughout an electromagnetic radiation wavelength range of 350 nm to 800 nm, wherein the transmittance is measured utilizing one or more of a spectrophotometer and a spectrometer.

According to an eighth aspect of the disclosure, the article of any one of the first through seventh aspects further comprising: an ultra-thin metal film disposed directly on the cupric oxide (CuO); wherein, the article comprises a transmittance greater than or equal to 65% throughout an electromagnetic radiation wavelength range of 300 nm to 1400 nm, wherein the transmittance is measured utilizing one or more of a spectrophotometer and a spectrometer; wherein, the ultra-thin metal film comprises one or more of silver (Ag), gold (Au), copper (Cu), and platinum (Pt); wherein, the ultra-thin metal film comprises a thickness within a range of 1 nm to 5 nm; and wherein, the article at the ultra-thin metal film has a sheet resistance of less than or equal to $10^8 \Omega/\square$, as measured with a probe station connected to a multimeter using a four-point method at four different sets of positions on the ultra-thin metal film and then averaged.

According to a ninth aspect of the disclosure, an article comprises: (i) a body, the body comprising a material; (ii) cupric oxide (CuO) in direct contact with the material of the body, the cupric oxide (CuO) comprising a thickness that is less than or equal to 1.3 nm; and (iii) an ultra-thin metal film disposed directly on the cupric oxide (CuO), the ultra-thin metal film comprising a thickness within a range of 1 nm to 5 nm; wherein, the article comprises a transmittance greater than or equal to 65% throughout an electromagnetic radiation wavelength range of 300 nm to 1400 nm, wherein the transmittance is measured utilizing one or more of a spectrophotometer and a spectrometer; and wherein, the article at the ultra-thin metal film has a sheet resistance of less than or equal to $10^8 \Omega/\square$, as measured with a probe station connected to a multimeter using a four-point method at four different sets of positions on the ultra-thin metal film and then averaged.

According to a tenth aspect of the disclosure, the article of the ninth aspect, wherein the material of the body comprises calcium fluoride ($CaF_2$).

According to an eleventh aspect of the disclosure, the article of any one of the ninth through tenth aspects, wherein the thickness of the cupric oxide (CuO) is less than or equal to 1.0 nm.

According to a twelfth aspect of the disclosure, the article of any one of the ninth through tenth aspects, wherein the thickness of the cupric oxide (CuO) is within a range of 0.4 nm to 0.7 nm.

According to a thirteenth aspect of the disclosure, the article of any one of the ninth through twelfth aspects, wherein the article is free of a layer of metallic copper (Cu) disposed between the cupric oxide (CuO) and the body.

According to a fourteenth aspect of the disclosure, the article of any one of the ninth through thirteenth aspects, wherein the ultra-thin metal film comprises one or more of silver (Ag), gold (Au), copper (Cu), and platinum (Pt).

According to a fifteenth aspect of the disclosure, the article of any one of the ninth through thirteenth aspects, wherein the ultra-thin metal film comprises one or more of silver (Ag) and gold (Au).

According to a sixteenth aspect of the disclosure, the article of any one of the ninth through fifteenth aspects, wherein the thickness of the ultra-thin metal film is less than or equal to 2 nm.

According to a seventeenth aspect of the disclosure, the article of any one of the ninth through twelfth aspects, wherein (i) the ultra-thin metal film comprises silver (Ag); and (ii) the transmittance of the article is greater than or equal to 75% throughout an electromagnetic radiation range of 300 nm to 1400 nm, wherein the transmittance is measured utilizing one or more of a spectrophotometer and a spectrometer.

According to an eighteenth aspect of the disclosure, the article of any one of the ninth through twelfth aspects, wherein (i) the ultra-thin metal film comprises silver (Ag); and (ii) the transmittance of the article is greater than or equal to 75% throughout an electromagnetic radiation range of 300 nm to 1200 nm, wherein the transmittance is measured utilizing one or more of a spectrophotometer and a spectrometer.

According to a nineteenth aspect of the disclosure, the article of any one of the ninth through twelfth aspects, wherein (i) the ultra-thin metal film comprises gold (Au); and (ii) the transmittance of the article is greater than or equal to 65% throughout an electromagnetic radiation range of 300 nm to 1400 nm, wherein the transmittance is measured utilizing one or more of a spectrophotometer and a spectrometer.

According to a twentieth aspect of the disclosure, the article of any one of the ninth through twelfth aspects, wherein (i) the ultra-thin metal film comprises gold (Au); and (ii) the transmittance of the article is greater than or equal to 70% throughout an electromagnetic radiation range of 300 nm to 1400 nm, wherein the transmittance is measured utilizing one or more of a spectrophotometer and a spectrometer.

According to a twenty-first aspect of the disclosure, a method of manufacturing an article comprises: applying cupric oxide (CuO) onto a body via a physical vapor deposition technique, the body comprising a material, and thus forming an article with the cupric oxide (CuO) in direct contact with the material of the body; wherein, the cupric oxide (CuO) has a thickness that is less than or equal to 1.3 nm; and the article comprises a transmittance greater than or equal to 90% throughout an electromagnetic radiation wavelength range of 300 nm to 800 nm, and the transmittance is measured utilizing one or more of a spectrophotometer and a spectrometer.

According to a twenty-second aspect of the disclosure, the method of the twenty-first aspect, wherein the physical vapor deposition technique is radio frequency magnetron sputtering.

According to a twenty-third aspect of the disclosure, the method of the twenty-second aspect, wherein the radio frequency magnetron sputtering (i) occurs at least partially within a chamber, (ii) uses a target disposed within the chamber, the target comprising cupric oxide (CuO), and (iii) occurs while oxygen ($O_2$) is disposed in the chamber.

According to a twenty-fourth aspect of the disclosure, the method of the twenty-third aspect, wherein the target comprises greater than or equal to 99 wt % cupric oxide (CuO).

According to a twenty-fifth aspect of the disclosure, the method of any one of the twenty-first through twenty-fourth aspects further comprising: applying an ultra-thin metal film directly on the cupric oxide (CuO) via a physical vapor deposition or thermal evaporation technique, thus forming a new article; wherein, the ultra-thin metal film comprises one or more of silver (Ag), gold (Au), copper (Cu), and platinum (Pt); wherein, the new article at the ultra-thin metal film has a sheet resistance of less than or equal to $2100\Omega/\square$, as measured with a probe station connected to a multimeter using a four-point method at four different sets of positions on the ultra-thin metal film and then averaged; and wherein, the new article comprises a transmittance of greater than or equal to 65% for all wavelengths of electromagnetic radiation through a range of 300 nm to 1400 nm, wherein the transmittance is measured utilizing one or more of a spectrophotometer and a spectrometer.

According to a twenty-sixth aspect of the present disclosure, an article comprises: (i) a body comprising a material; (ii) cupric oxide (CuO) in direct contact with the material of the body; (iii) an ultra-thin metal film comprising a metal disposed directly on the cupric oxide (CuO), the ultra-thin metal film further comprising a thickness within a range of 1 nm to 5 nm; and (iv) a second film comprising the same metal as the ultra-thin metal film disposed on the substrate but not contacting the ultra-thin metal film, the second film further comprising a thickness that is greater than the thickness of the ultra-thin metal film; wherein, the article at the ultra-thin metal film has a sheet resistance of less than or equal to $10^8 \Omega/\square$, as measured with a probe station connected to a multimeter using a four-point method at four different sets of positions on the ultra-thin metal film and then averaged.

According to a twenty-seventh aspect of the present disclosure, the article of the twenty-sixth aspect further comprising: a layer of an electrically conductive ionic gel contiguously disposed over both the ultra-thin metal film and the second film.

According to a twenty-eighth aspect of the present disclosure, the article of any one of the twenty-sixth through twenty-seventh aspects, wherein the ultra-thin metal film comprises a contiguous perimeter and spaced ribbons extending between, and contiguous with, opposing sides of the contiguous perimeter.

According to a twenty-ninth aspect of the present disclosure, the article of any one of the twenty-sixth through twenty-eighth aspects, wherein the cupric oxide (CuO) comprises a thickness that is less than or equal to 1.3 nm.

DETAILED DESCRIPTION

Figure 1:
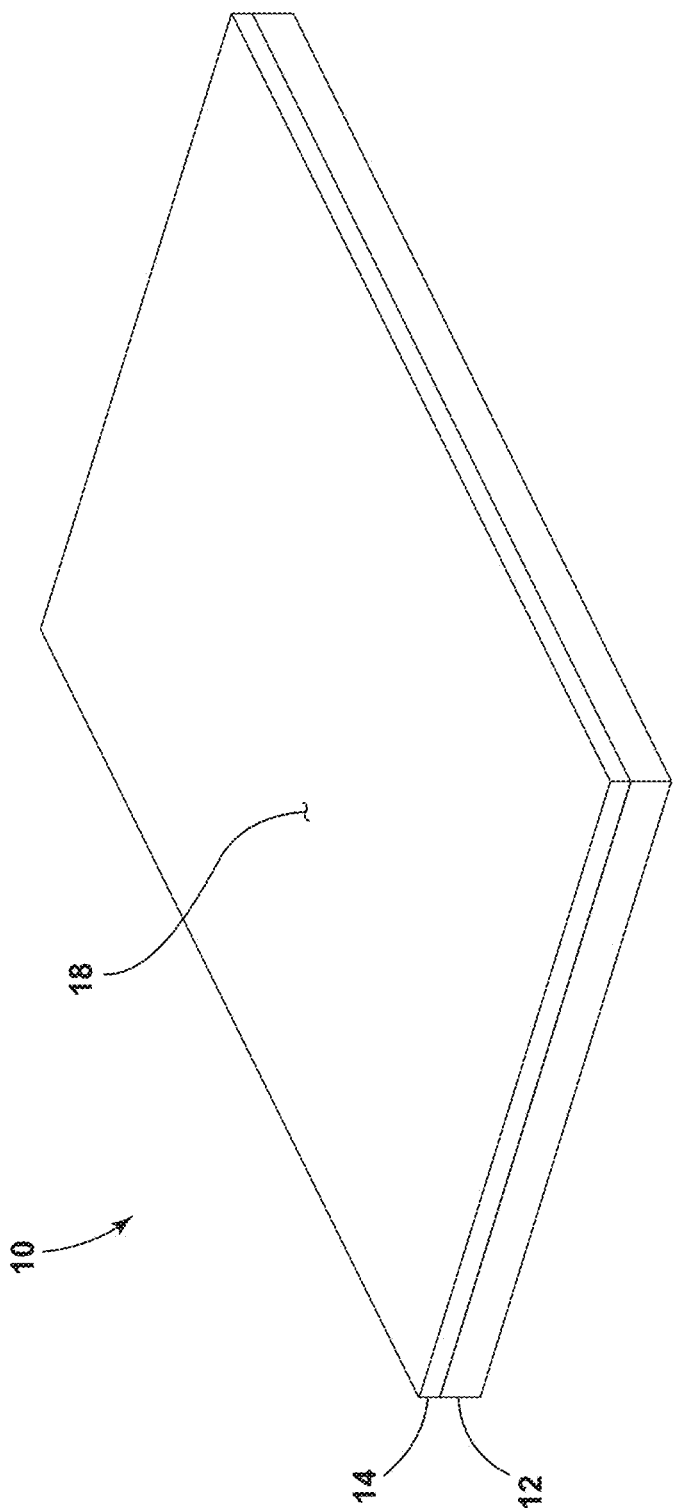
FIG. 1 is a perspective view of an article, illustrating the article having a body and cupric oxide (CuO) in direct contact with material of the body.
Figure 2:
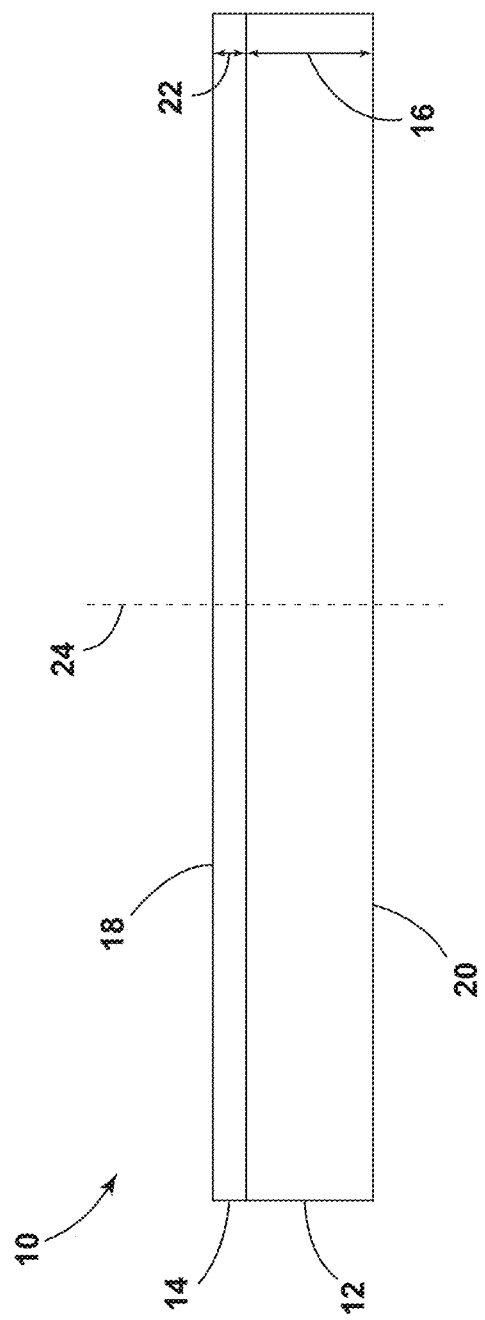
FIG. 2 is an elevation view of the article of FIG. 1, illustrating an optical axis extending through a first primary surface of the article that the cupric oxide (CuO) provides and through a second primary surface of the article that the body provides.

Referring to FIGS. 1 and 2, an article 10 includes a body 12 and cupric oxide (CuO) 14. The body 12 includes a material, and the cupric oxide (CuO) 14 is in direct contact with the material of the body 12. In embodiments, the body 12 has a thickness 16 within a range of 10 μm to 10 mm. The thickness 16 of the body 12 is determined with a micrometer. The article 10 is free of a layer of metallic copper (Cu) disposed between the cupric oxide (CuO) and the body 12. Stated another way, there is no metallic copper (Cu) disposed between the cupric oxide (CuO) 14 and the body 12. The article 10 has a first primary surface 18 and a second primary surface 20. The cupric oxide (CuO) 14 provides the first primary surface 18 of the article 10. The body 12 provides the second primary surface 20 of the article 10.

The cupric oxide (CuO) 14 has a thickness 22. The thickness 22 of the cupric oxide (CuO) 14 is less than or equal to 1.3 nm. In embodiments, the thickness 22 of the cupric oxide (CuO) 14 is less than or equal to 1.0 nm. In embodiments, the thickness 22 of the cupric oxide (CuO) 14 is 0.4 nm, 0.5 nm, 0.6 nm, 0.7 nm, 0.8 nm, 0.9 nm, 1.0 nm, 1.1 nm, 1.2 nm, 1.3 nm, or within a range bounded by any two of those values (e.g., 0.4 nm to 0.7 nm, 0.5 nm to 0.9 nm, 0.4 nm to 1.0 nm, etc.). The thickness 22 of the cupric oxide (CuO) 14 is determined via atomic force microscopy or via transmission electron microscopy.

An optical axis 24 of the article 10 extends through the first primary surface 18, the thickness 22 of the cupric oxide (CuO) 14, the thickness 16 of the body 12, and the second primary surface 20 of the article 10. The first primary surface 18 and the second primary surface 20 face in generally opposite directions. The first primary surface 18 and the second primary surface 20 of the article 10 illustrated are rectangular, but they could be square, circular, elliptical, or any other shape. In the illustrated embodiment of the article 10, the first primary surface 18 and the second primary surface 20 are planar and parallel, but they need not be and can be curved, spherical, concave, convex, aspheric, faceted, and so on.

The body 12 is generally transparent to wavelengths of electromagnetic radiation desired for applications of the article 10. More specifically, in embodiments, the body 12 has a transmittance of greater than or equal to 90% throughout a desired electromagnetic radiation wavelength range, such as 210 nm to 1000 nm, 350 nm to 2200 nm, 300 nm to 2000 nm, or 250 nm to 800 nm. In embodiments, the transmittance of the body 12 is greater than or equal to 90% for electromagnetic radiation having a wavelength of 210 nm, 220 nm, 230 nm, 240 nm, 250 nm, 300 nm, 350 nm, 400 nm, 500 nm, 600 nm, 700 nm, 800 nm, 900 nm, 950 nm, 1000 nm, 1100 nm, 1200 nm, 1300 nm, 1400 nm, 1500 nm, 1600 nm, 1700 nm, 1800 nm, 1900 nm, 2000 nm, 2100 nm, 2200 nm, or throughout an electromagnetic radiation wavelength range bounded by any two of those values (e.g., 240 nm to 1800 nm, 400 nm to 1300 nm, etc.). "Transmittance" is defined as the percentage of incident optical power within a given wavelength range transmitted along the optical axis 24 through the sample (e.g., the body 12, the article 10, and so on). Transmittance as a function of wavelength (i.e., the transmittance spectra) is determined, for purposes of this disclosure, with one or more of a spectrophotometer (e.g., Pelkin Elmer LAMBDA 950) and a spectrometer (e.g., BrukerTrensor Fourier-transform infrared spectrometer). The Pelkin Elmer LAMBDA 950 was utilized for purposes of this disclosure having a resolution of 5 nm for wavelengths of 175 nm to 900 nm.

The sample analyzed with the spectrophotometer and the spectrometer had dimensions of about 1.6 cm×1.6 cm×1 mm (thickness).

The material of the body 12 can be or comprise an inorganic glass, semiconductor, or organic polymer. Examples of inorganic glass include an alkaline earth aluminosilicate glass, a boroaluminosilicate glass (e.g., Pyrex®), doped and undoped fused silica, fused quartz, a transparent glass-ceramic material, and crystalline material, such as $CaF_2$, $MgF_2$, and the like. Examples of organic polymers include polyamides, polyesters, polyimides, polysulfones, polycarbonates, polyurethanes, polyurethane-ureas, polyolefins, phenol resins, epoxy resins, and the like. Other examples include homopolymers and copolymers of polyol (allylcarbonate) monomers such as the diethylene glycol bis(allyl carbonate) sold under the trademark CR-39® by PPG Optical Products, homopolymers and copolymers of mono or poly-functional (meth)acrylate, cellulose acetate, cellulose triacetate, cellulose acetate butyrate, cellulose acetate propionate, polyvinyl(acetate), poly(vinyl alcohol), poly(vinyl chloride), polyurethanes, polyurethane-urea such as TRIVEX™ or NXT® respectively sold by PPG Optical Products and Intercast Europe Spa, poly(thiourethanes), polyamides, polycarbonates such as those derived from bisphenol-A and phosgene sold under the trade mark LEXAN®, polyesters such as poly(ethylene terephtalate), polystyrene, copolymers of styrene and methyl methacrylate or acrylonitrile, cyclic polyolefin copolymers (COC), amorphous polyolefin such as Zeonex® from ZEON Corp, and the like. In embodiments, the material of the body 12 comprises fused silica or $CaF_2$. In embodiments, the material of the body 12 comprises $CaF_2$.

The article 10, which is the body 12 with the cupric oxide (CuO) 14 in direct contact with the material of the body 12, has a transmittance of greater than or equal to 90% throughout a desired electromagnetic radiation wavelength range. In embodiments, the transmittance of the article 10 is greater than or equal to 90% throughout an electromagnetic radiation wavelength range of 300 nm to 800 nm. In embodiments, the transmittance of the article 10 is greater than or equal to 90% throughout an electromagnetic radiation wavelength range of 350 nm to 800 nm. In embodiments, the transmittance of the article 10 is greater than or equal to 90% throughout an electromagnetic radiation wavelength range of 350 nm to 6 µm. In embodiments, the transmittance of the article 10 is greater than or equal to 90% for electromagnetic radiation having a wavelength of 300 nm, 350 nm, 400 nm, 450 nm, 500 nm, 550 nm, 600 nm, 650 nm, 700 nm, 750 nm, 800 nm, 900 nm, 1 µm, 2 µm, 3 µm, 4 µm, 5 µm, 6 µm, or throughout an electromagnetic radiation wavelength range bounded by any two of those values (450 nm to 800 nm, 600 nm to 750 nm, 800 nm to 5 µm, etc.).

Figure 3:
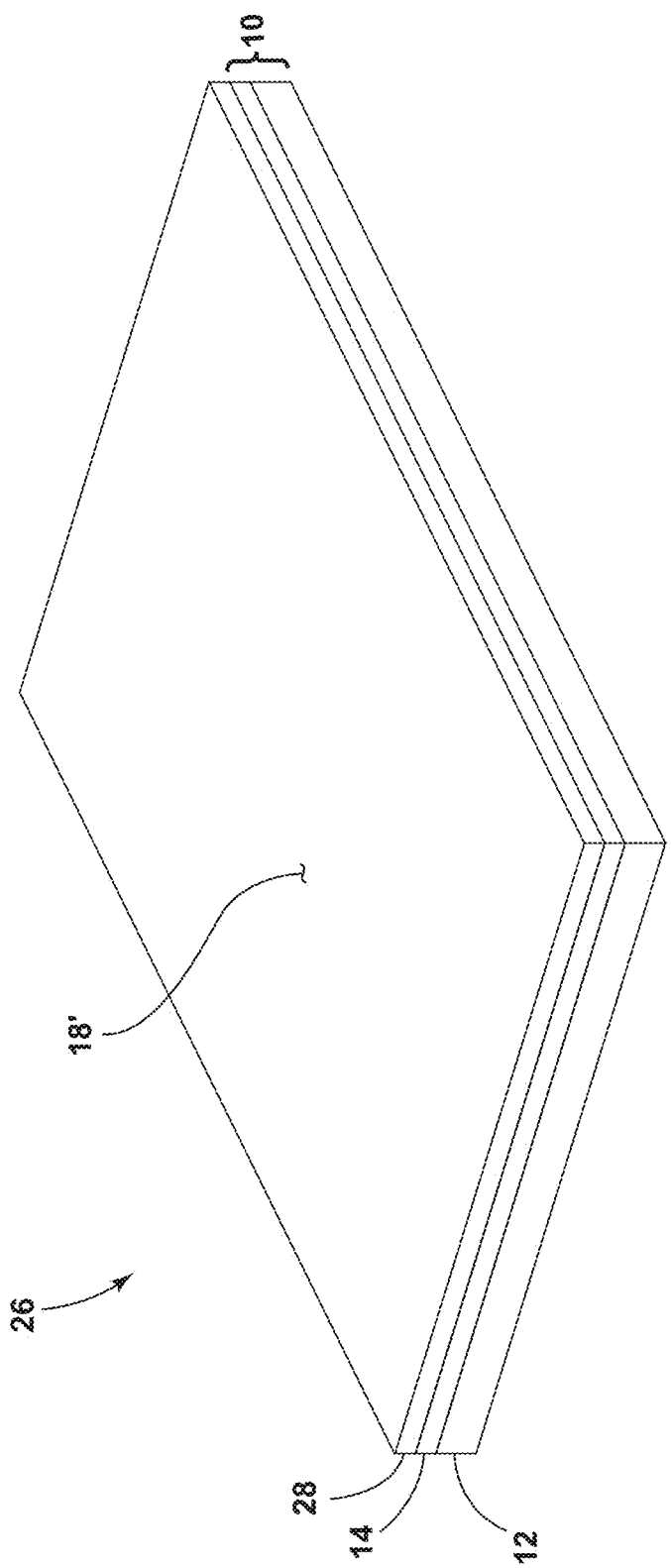
FIG. 3 is a perspective view of an article, illustrating the article of FIG. 1 further including an ultra-thin metal film disposed on the cupric oxide (CuO)
Figure 4:
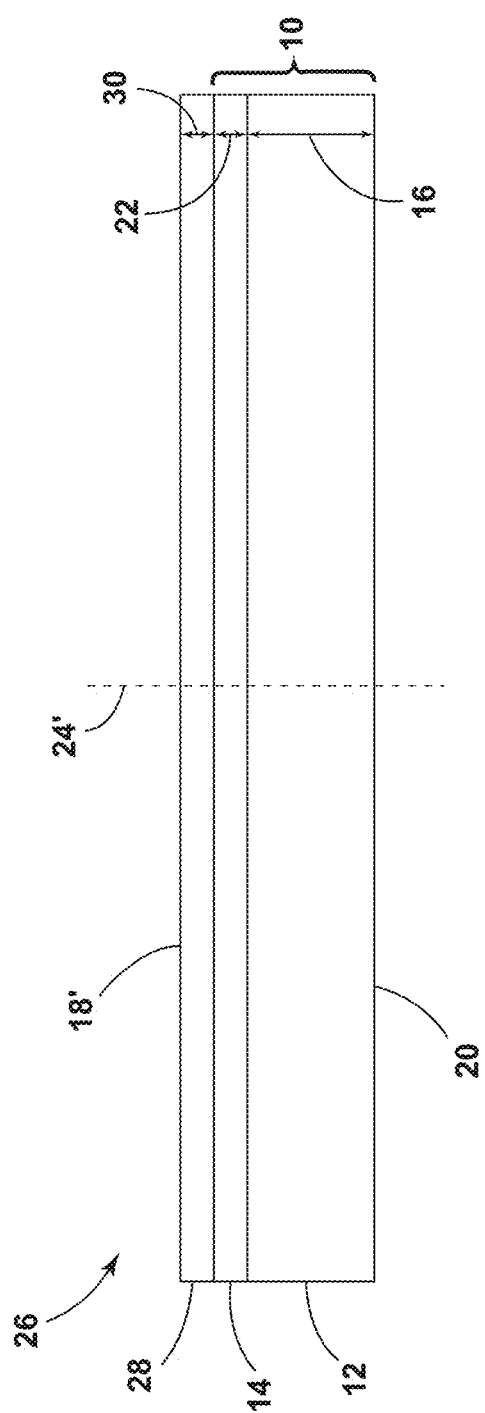
FIG. 4 is an elevation view of the article of FIG. 3, illustrating the optical axis extending through a first primary surface of the article that the ultra-thin metal film provides and through the second primary surface of the article that the body provides.

Referring now to FIGS. 3 and 4, an article 26 includes the body 12, the cupric oxide (CuO) 14 in direct contact with the material of the body 12, and an ultra-thin metal film 28 disposed directly on the cupric oxide (CuO) 14. In other words, the article 26 of FIGS. 3 and 4 is the article 10 of FIGS. 1 and 2 but further including the ultra-thin metal film 28 disposed directly on the cupric oxide (CuO) 14. That is, the ultra-thin metal film 28 is disposed over the first primary surface 18 of the article 10 and now provides a first primary surface 18' of the article 26. Instead of the cupric oxide (CuO) 14, the ultra-thin metal film 28 provides the first primary surface 18' of the article 26. Further, as with the article 10, the article 26 is free of a layer of metallic copper (Cu) disposed between the cupric oxide (CuO) 14 and the body 12.

The ultra-thin metal film 28 has a thickness 30. In embodiments, the thickness 30 of the ultra-thin metal film 28 is within a range of 1 nm to 5 nm. In embodiments, the thickness 30 of the ultra-thin metal film 28 is less than or equal to 5 nm. In embodiments, the thickness 30 of the ultra-thin metal film 28 is less than or equal to 3 nm. In embodiments, the thickness 30 of the ultra-thin metal film 28 is less than or equal to 2 nm. In embodiments, the thickness 30 of the ultra-thin metal film 28 is 1 nm, 1.3 nm, 1.5 nm, 2 nm, 3 nm, 4 nm, 5 nm, or within a range bounded by any two of those values (e.g., 1.5 nm to 3 nm, 2 nm to 4 nm, etc.). An optical axis 24' of the article 26 extends through the first primary surface 18', the thickness 30 of the ultra-thin metal film 28, the thickness 22 of the cupric oxide (CuO) 14, the thickness 16 of the body 12, and the second primary surface 20.

In embodiments, the ultra-thin metal film 28 includes one or more of silver (Ag), gold (Au), copper (Cu), and platinum (Pt). In embodiments, the ultra-thin metal film 28 includes one or more of silver (Ag) and gold (Au). In embodiments, the ultra-thin metal film 28 includes silver (Ag). In embodiments, the ultra-thin metal film 28 includes gold (Au). In embodiments, the ultra-thin metal film 28 is silver (Ag). In embodiments, the ultra-thin metal film 28 is gold (Au).

The article 26, which includes both the cupric oxide (CuO) 14 and the ultra-thin metal film 28, has a transmittance of greater than or equal to 65% throughout an electromagnetic radiation wavelength range of 300 nm to 1400 nm. In embodiments, the transmittance of the article 26 is greater than or equal to 78% throughout an electromagnetic radiation wavelength range of 300 nm to 1400 nm. In embodiments, the transmittance of the article 26 is greater than or equal to 75% throughout an electromagnetic radiation wavelength range of 300 to 1200 nm, including for example when the ultra-thin metal film 28 is or comprises silver (Ag). In embodiments, the transmittance of the article 26 is greater than or equal to 75% throughout an electromagnetic radiation wavelength range of 300 to 800 nm, including for example when the ultra-thin metal film 28 is or comprises silver (Ag). In embodiments, the transmittance of the article 26 is greater than or equal to 70% throughout an electromagnetic radiation wavelength range of 300 nm to 900 nm, including for example when the ultra-thin metal film 28 is or comprises gold (Au). In embodiments, the transmittance of the article 26 is greater than or equal to 70% throughout an electromagnetic radiation wavelength range of 400 nm to 900 nm, including for example when the ultra-thin metal film 28 is or comprises gold (Au). In embodiments, the transmittance of the article 26 is greater than or equal to 65% throughout an electromagnetic radiation wavelength range of 400 nm to 1000 nm, including for example when the ultra-thin metal film 28 is or comprises gold (Au).

The article 26 is electrically conductive at the ultra-thin metal film 28. For purposes of this disclosure, the article 26 is electrically conductive at the ultra-thin metal film 28 when the article 26 has a measurable sheet resistance at the ultra-thin metal film 28. In embodiments, the article 26, at the ultra-thin metal film 28, has a sheet resistance of less than or equal to $10^8 \Omega/\square$. In embodiments, the article 26, at the ultra-thin metal film 28, has a sheet resistance of less than or equal to $10^7 \Omega/\square$. In embodiments, the article 26, at the ultra-thin metal film 28, has a sheet resistance of less than or equal to $10^6 \Omega/\square$. In embodiments, the article 26, at the ultra-thin metal film 28, has a sheet resistance of less than or equal to $10^5 \Omega/\square$. In embodiments, the article 26, at the ultra-thin metal film 28, has a sheet resistance of less than or equal to $10^4 \Omega/\square$. In embodiments, the article 26, at the ultra-thin metal film 28, has a sheet resistance of less than or equal to $2100 \Omega/\square$. In embodiments, the article 26, at the ultra-thin metal film 28, has a sheet resistance of less than or equal to $2000 \Omega/\square$. In embodiments, the article 26, at the ultra-thin metal film 28, has a sheet resistance of less than or equal to $1900 \Omega/\square$. In embodiments, the article 26, at the ultra-thin metal film 28, has a sheet resistance of less than or equal to $10^3 \Omega/\square$. In embodiments, the sheet resistance of the article 26, at the ultra-thin metal film 28, is less than or equal to $400 \Omega/\square$. In embodiments, the sheet resistance of the article 26, at the ultra-thin metal film 28, is less than or equal to $100 \Omega/\square$. In embodiments, the sheet resistance of the article 26, at the ultra-thin metal film 28, is less than or equal to $50 \Omega/\square$. In embodiments, the sheet resistance of the article 26, at the ultra-thin metal film 28, is within a range of $30 \Omega/\square$ to $50 \Omega/\square$. In embodiments, the sheet resistance of the article 26, at the ultra-thin metal film 28, is within a range of $50 \Omega/\square$ to $100 \Omega/\square$. In embodiments, the sheet resistance of the article 26, at the ultra-thin metal film 28, is within a range of $10 \Omega/\square$ to $100 \Omega/\square$. For purposes of this disclosure, the sheet resistance is measured using the four-point method with a Cascade Microtech 44/7 S 2749 four-point probe system with a Keithley 2001 multimeter, at four different sets of positions on the ultra-thin metal film 28, and then averaged. The sample for sheet resistance measurement has approximate dimensions of 1.6 cm×1.6 cm×1 mm (the 1 mm being the thickness).

In embodiments, the article 26 at the ultra-thin metal film 28 has a surface roughness ($R_q$) of 0.5 nm or less. In embodiments, the article 26 at the ultra-thin metal film 28 has a surface roughness ($R_q$) of 0.2 nm, 0.3 nm, 0.4 nm, 0.5 nm, or within a range between any two of those values (e.g., 0.2 nm to 0.4 nm, etc.). The surface roughness ($R_q$) can be determined with an atomic force microscope (e.g., Park NX20 AFM system).

Figure 5:
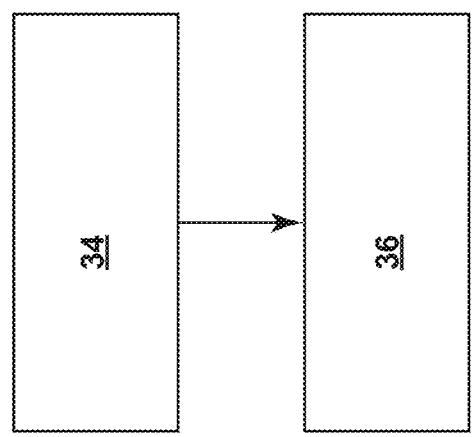
FIG. 5 is a flow chart of a method of forming the articles of FIGS. 1-4.

Referring now to FIG. 5, a method 32 of manufacturing the article 10, and subsequently the article 26, is herein described. The method 32 includes, at a step 34, applying the cupric oxide (CuO) 14 directly onto the body 12 via a physical vapor deposition technique, thus forming the article with the cupric oxide (CuO) in direct contact with the material of the body 12. Examples of physical vapor deposition techniques include vacuum evaporation, ion beam assisted deposition, sputtering, ion plating, and like methods. In embodiments, the physical vapor deposition technique is radio frequency ("RF") magnetron sputtering. With RF magnetron sputtering, material is ejected from a "target" disposed within a chamber and the material that was ejected deposits on the body 12, which is also in the chamber. The "target" for step 34 is cupric oxide (CuO) and not metallic copper (Cu). In embodiments, the target is at least 99% by weight cupric oxide (CuO). In embodiments, oxygen ($O_2$) is disposed in the chamber, which prevents inadvertent reduction of ejected molecules of cupric oxide (CuO) before the molecules deposit upon the body 12. The article 10 is thus formed with the cupric oxide (CuO) 14 directly in contact with the material of the body 12. Other than cleaning the surface of the body 12 to which the cupric oxide (CuO) 14 is to be disposed, the surface of the body 12 does not require pre-treatment with temperature or chemicals.

The step 34 of the method 32, using cupric oxide (CuO) as the target, results in the article 10 that is different than an article that would result if metallic copper (Cu) were used as the target. If metallic copper (Cu) were instead utilized as the target, a layer of metallic copper (Cu) would form on the body 12. The layer of metallic copper (Cu) can then be oxidized, which would result in cupric oxide (CuO) and cuprous oxide ($Cu_2O$) forming at the surface with the metallic copper (Cu), with the remainder of the layer beneath the surface remaining metallic copper (Cu). As the layer of metallic copper (Cu) oxidizes into cupric oxide (CuO), the thickness of the layer increases. That is because the metallic copper has a cubic structure and cuprous oxide (CuO) has a taller, monoclinic, structure. The increasing thickness of the layer decreases the transparency of the layer. The step 34 of the method 32, applying the cupric oxide (CuO) 14 directly from the cupric oxide (CuO) target, allows the thickness 22 of the cupric oxide (CuO) 14 to be controlled (and thus the transparency of the article 10 maintained) because there is no concomitant swelling of the thickness of the layer that would result if the layer were applied as metallic copper (Cu) and then subsequently oxidized. Further, metal oxides such as cupric oxide (CuO) are more transparent than their metallic counterparts such as copper (Cu), and cupric oxide (CuO) is more transparent than cuprous oxide ($Cu_2O$).

In a step 36, the method 32 further includes applying the ultra-thin metal film 28 directly on the cupric oxide (CuO) 14 via a physical deposition technique, thus forming the article 26 (i.e., a "new article" from the article 10). In embodiments, the physical deposition technique is thermal evaporation or sputtering (including RF magnetron sputtering). In thermal evaporation, a source material (here, the metal to form the ultra-thin metal film 28) is evaporated in a vacuum. The source metal then condenses upon the cupric oxide (CuO) 14 of the article 10, thus forming the ultra-thin metal film 28 and thus the article 26.

The article 26 is useful for many applications, such as a transparent conductor, a low-emission coating, a smart window, a plasmonic sensor, an optical modulator, a flat optical component, and a meta-lens. In addition, the article 26 can be further modified to include one or more further layers over the ultra-thin metal film 28. Those one or more further layers can include an additional ultra-thin metal film, graphene, a dielectric, among others, to form multi-layer articles with ad hoc functionalities.

Figure 6A:
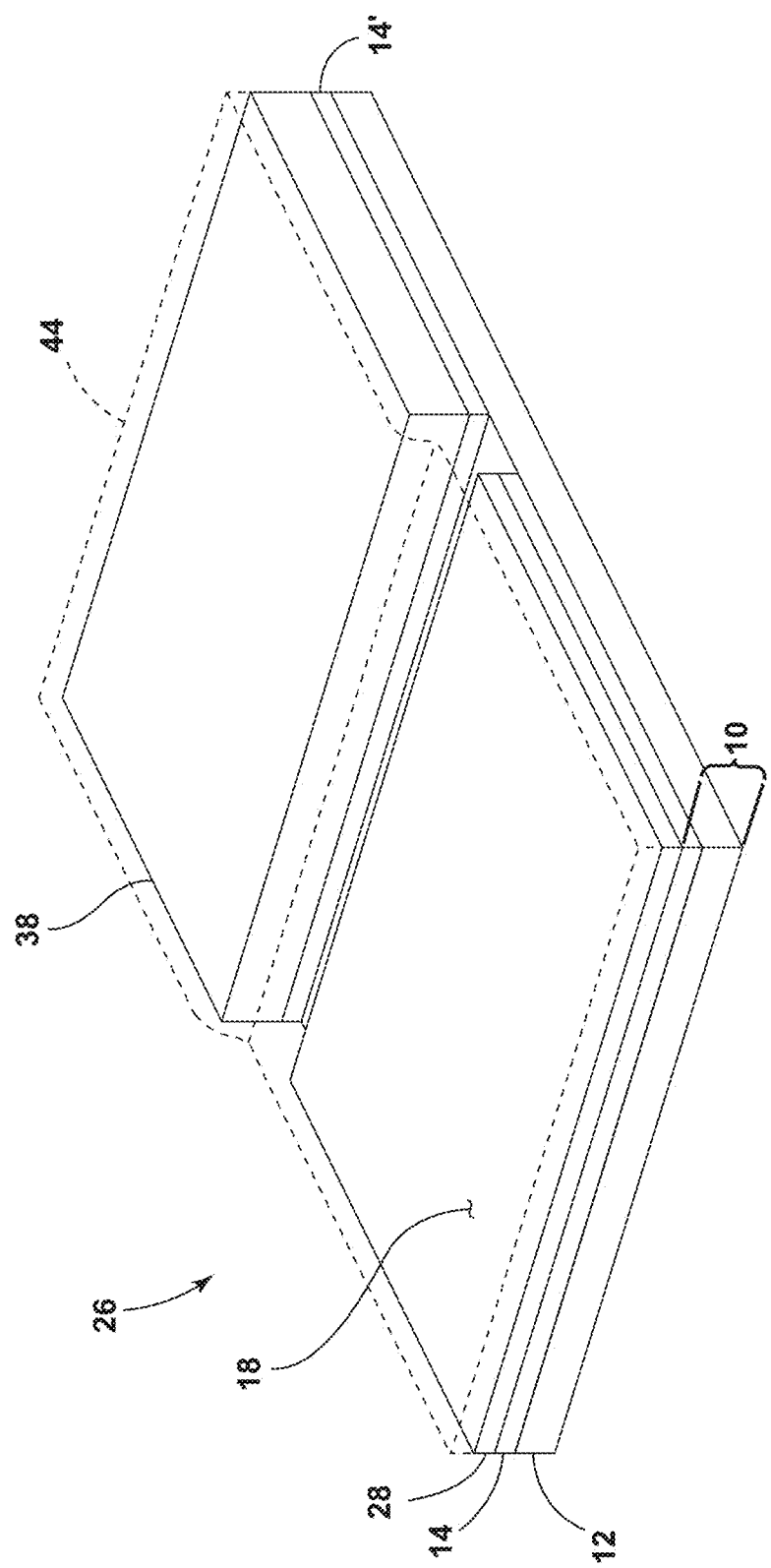
FIG. 6A is a perspective view of the article of FIG. 3 but further including a second (thicker) film of metal disposed on the body but not connected to the ultra-thin metal film and a layer of an electrically conductive ionic gel continuously disposed over both the ultra-thin metal film and the second film of metal.
Figure 6B:
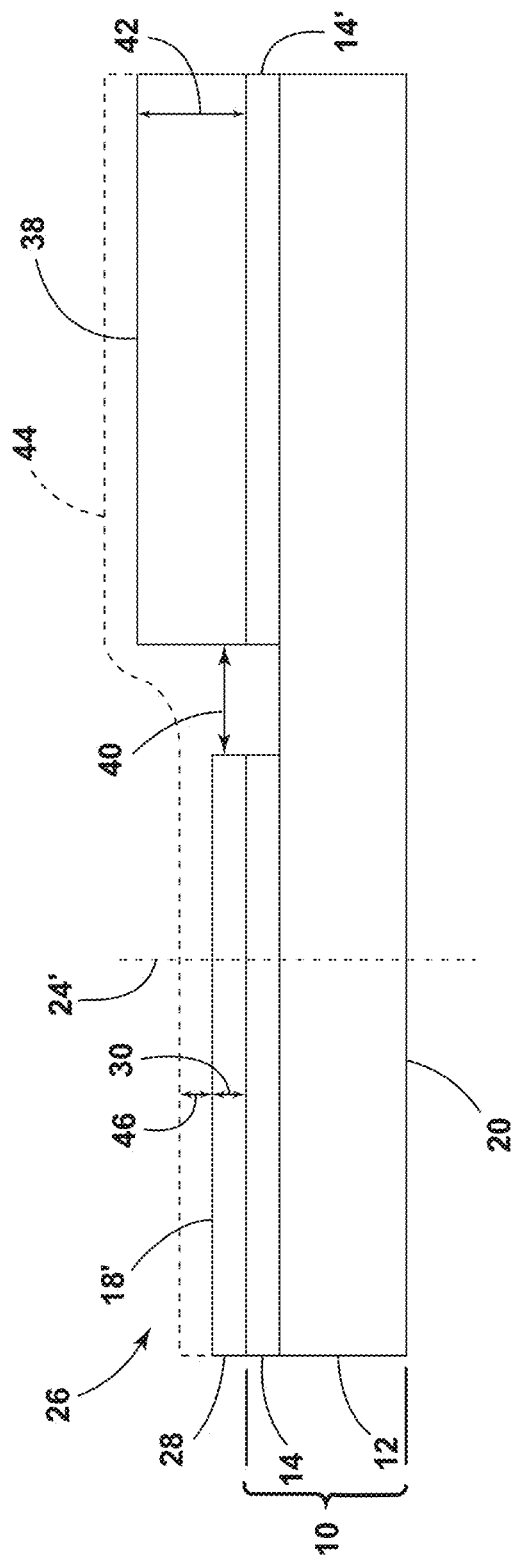
FIG. 6B is an elevation view of the article of FIG. 6A.
Figure 6C:
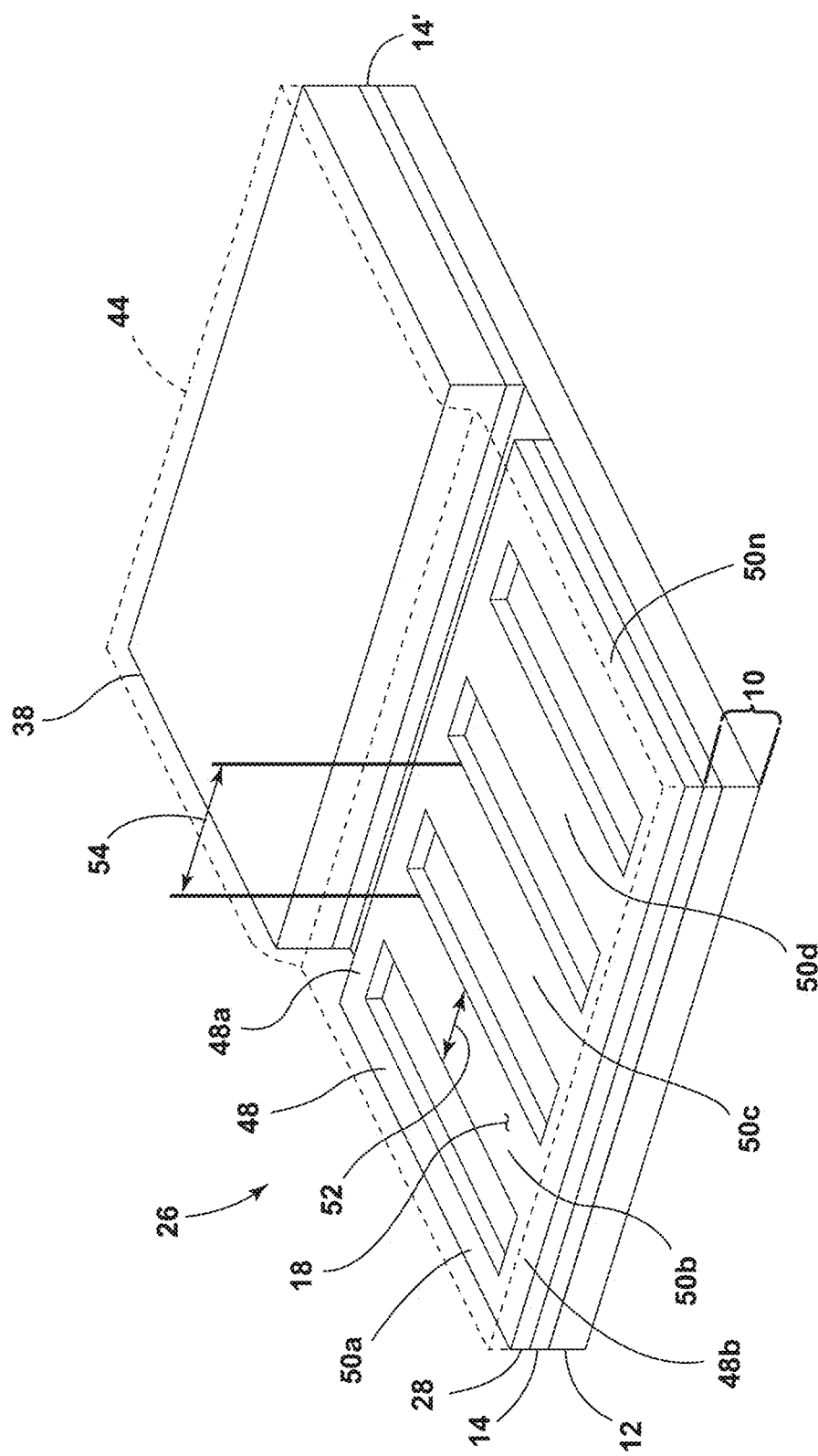
FIG. 6C is a perspective view of an article similar to the article of FIG. 3 but the ultra-thin metal film takes the form of spaced ribbons (nano-ribbons)

For example, referring now to FIGS. 6A-6C, in embodiments, the article 10 further includes a second film 38 that is disposed on the body 12 but not connected to the ultra-thin metal film 28 and separated therefrom by a gap 40. The second film 38 has a thickness 42. The thickness 42 of the second film 38 is greater than the thickness 30 of the ultra-thin metal film 28. The second film 38 comprises or is the same metal as the metal that forms the ultra-thin metal film 28. The second film 38 can be disposed directly on the material of the body 12. In embodiments, as illustrated, the second film 38 is disposed on cupric oxide (CuO) 14', which is disposed on the body 12 in the same manner as the cupric oxide (CuO) 14.

In embodiments, the article 10 further includes a layer 44 of an electrically conductive ionic gel contiguously disposed over both the ultra-thin metal film 28 and the second film 38. The layer 44 of the electrically conductive ionic gel provides an electrically conductive path between the ultra-thin metal film 28 and the second film 38. The electrically conductive path allows a voltage differential to be applied between the ultra-thin metal film 28 and the second film 38. As will be further elucidated in the Example 5 below, the optical properties (e.g., reflectance) of the article along the optical axis 24' extending through the ultra-thin metal film 28 can be reversibly altered as a function of the voltage differential. The layer 44 of an electrically conductive ionic gel has a thickness 46. In embodiments, the thickness 46 of the electrically conductive ionic gel disposed over the ultra-thin metal film 28 is 100 nm to 200 nm, such as about 140 nm.

In embodiments, the ionic gel includes an ionic liquid, a polymer matrix, and a solvent. In embodiments, the ionic liquid is one or more of 1-ethyl-3-methylimidazolium bis(trifluoromethylsulfonyl)imide (EMIM-TFSI), 1-ethyl-3-methyl-imidazolium ethylsulfate, 1-butyl-3-methylimidazolium hexafluorophosphate, 1-butyl-3-methylimidazolium tetrafluoroborate, 1-hexyl-3-methylimidazolium hexafluorophosphate, 1-butyl-3-methylimidazolium bis(trifluoromethanesulfonyl)imide, 1-ethyl-3-methylimidazolium trifluoromethanesulfonate, scandium(III) trifluoromethanesulfonate, praseodymium (III) trifluoromethanesulfonate, 1,3-dialkyl-1,2,3-triazolium hexafluorophosphate, 1,3-dialkyl-1,2,3-triazolium bis(trifluoromethanesulfonyl)imide, and 1,2,4-trimethylpyrazolium methylsulfate. In embodiments, the polymer matrix is one or more of a poly(styrene)-poly(ethylene oxide)-poly(styrene) ("PS-PEO-PS") triblock copolymer, poly(styrene)-poly(methyl methacrylate)-poly(styrene) ("PS-PMMA-PS") triblock copolymer, poly(ethylene glycol diacrylate) ("PEGDA"), and poly[(styrene-r-vinylbenzyl azide)-b-ethylene oxide-b-(styrene-r-vinylbenzylazide)] ("SOS-N3"). In embodiments, the solvent is acetonitrile, dichloromethane, or ethyl acetate.

In embodiments (see particularly FIG. 6C), the ultra-thin metal film 28 comprises a contiguous perimeter 48 and spaced parallel ribbons 50a, 50b, 50c, 50d, . . . 50n that extend between, and are contiguous with, opposing sides 48a, 48b of the contiguous perimeter. In other words, the ultra-thin metal film 28 can take the form of a grating (may be referred to as a nano-ribbon array), and need not form an uninterrupted volume without voids. Each of the spaced ribbons 50a, 50b, 50c, 50d, . . . 50n has a width 52. In embodiments, the widths 52 of all of the spaced parallel ribbons 50a, 50b, 50c, 50d, . . . 50n are the same or substantially the same (e.g., +/−5%). In embodiments, the width 52 is within a range of 500 nm to 2.0 µm. In embodiments, the width 52 is 500 nm, 600 nm, 700 nm, 800 nm, 900 nm, 1 µm, 1.1 µm, 1.2 µm, 1.3 µm, 1.4 µm, 1.5 µm, 1.6 µm, 1.7 µm, 1.8 µm, 1.9 µm, 2.0 µm, or within a range bounded by any two of those values (e.g., 800 nm to 900 nm, 600 nm to 1.4 µm, and so on). In embodiments, the spaced ribbons 50a, 50b, 50c, 50d, . . . 50n repeat at a constant or substantially constant (e.g., +/−5%) period 54 of 700 nm to 1.0 µm. In embodiments, the period 54 is 500 nm, 600 nm, 700 nm, 800 nm, 900 nm, 1 µm, 1.1 µm, 1.2 µm, 1.3 µm, 1.4 µm, 1.5 µm, 1.6 µm, 1.7 µm, 1.8 µm, 1.9 µm, 2.0 µm, or within a range bounded by any two of those values (e.g., 800 nm to 900 nm, 600 nm to 1.4 µm, and so on). In embodiments, the spaced ribbons 50a, 50b, 50c, 50d, . . . 50n are parallel or substantially parallel.

EXAMPLES

Figure 7A:
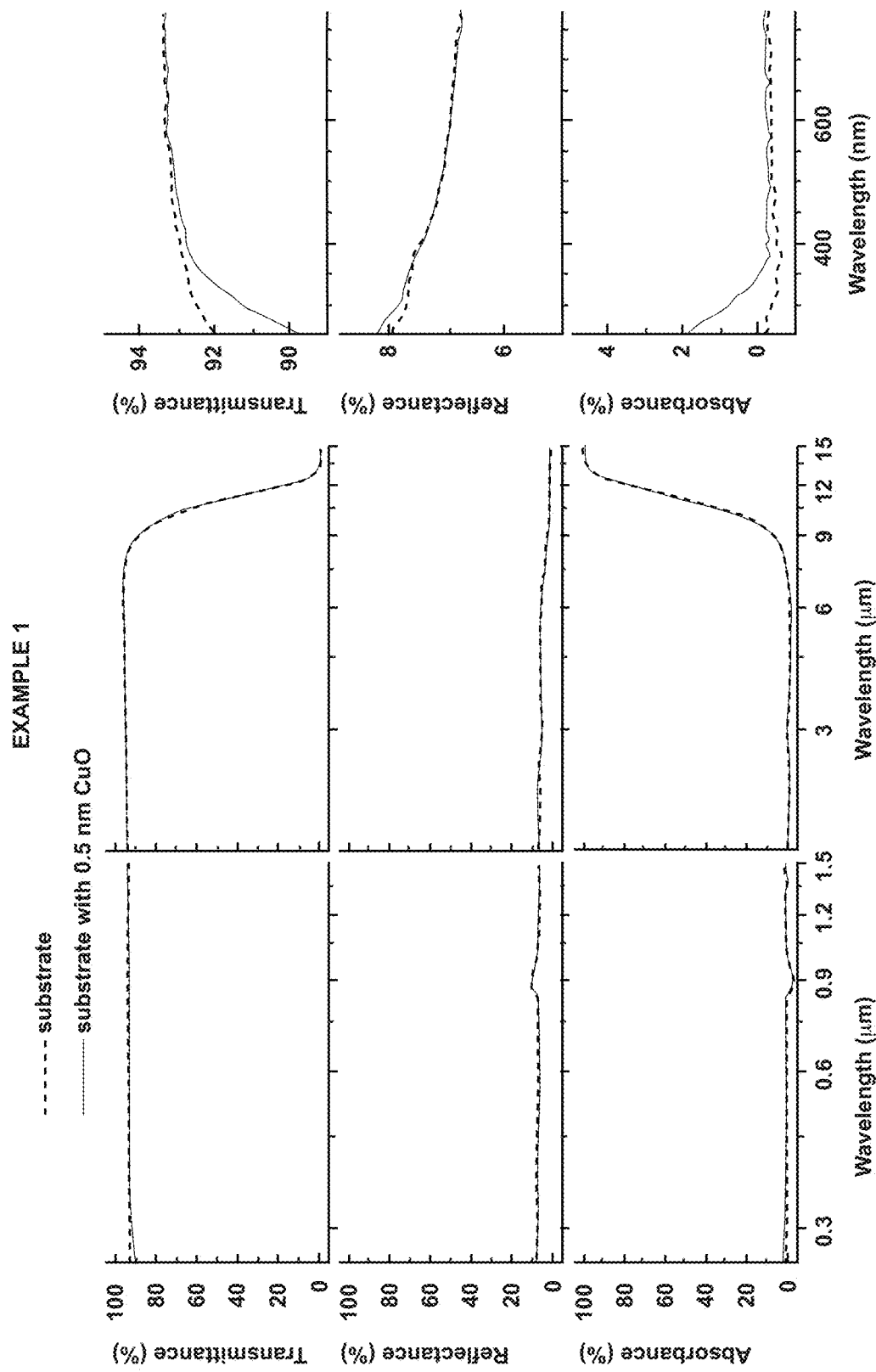
FIG. 7A, pertaining to an Example 1 (of the article of FIGS. 1 and 2), reproduces graphs of transmittance, reflectance, and absorbance as a function of wavelength of electromagnetic radiation across a range of wavelengths from 250 nm to 15 μm for (i) a body (that comprises a material comprising fused silica) alone and (ii) an article with cupric oxide (CuO) (thickness of 0.5 nm) disposed on the body, illustrating that the cupric oxide (CuO) of such a thickness negligibly affects the measured properties at wavelengths above 450 nm and only slightly affects the measured properties at wavelengths from 250 nm to 450 nm.
Figure 7B:
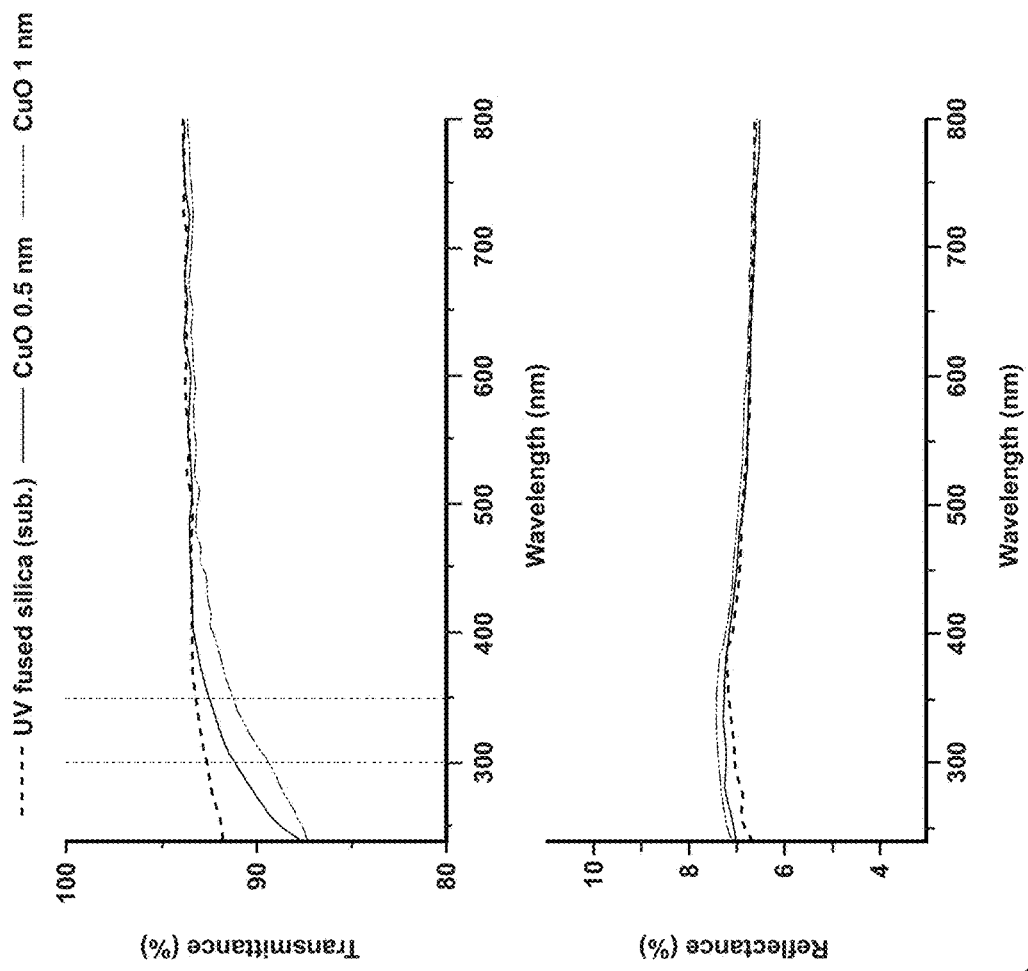
FIG. 7B, also pertaining to Example 1, reproduces two graphs—(i) a top graph of transmittance of the article as a function of wavelength of electromagnetic radiation, illustrating that cupric oxide (CuO) having a thickness of 1 nm affects the transmittance of the article more than cupric oxide (CuO) having a thickness of 0.5 nm (and the transmittance of the body without any such cupric oxide (CuO) is added for comparison), and (ii) a bottom graph of reflectance of the article as a function of wavelength, illustrating that the articles with cupric oxide (CuO) of 0.5 nm and 1 nm thickness respectively are only very slightly more reflective than the body alone (i.e., without any cupric oxide (CuO))

Example 1—In Example 1, and in reference to FIGS. 7A and 7B, samples of high purity fused silica and $CaF_2$ were cleaned with acetone in an ultrasonic bath followed by isopropanol rinsing for 5 minutes. Each sample was then dried with nitrogen flow.

Two samples of the high purity fused silica and one sample of the $CaF_2$ were separately introduced into a sputtering chamber. The sputtering chamber was evacuated to a base pressure of about $10^{-7}$ to $10^{-8}$ Torr. The sample was then exposed to an argon (Ar) plasma (bias power 40 W, pressure 8 mT, Ar flow of 22 sscm) to clean the surface of the sample before sputter deposition began.

RF magnetron sputtering was then initiated using a target of 99.7 wt % to 99.9 wt % pure cupric oxide (CuO) with a RF power of 150 W and a working pressure of 2 mTorr in argon (20 sscm) and oxygen (2 sccm) atmosphere. The oxygen was added to prevent reduction of the cupric oxide (CuO) molecules. The sample holder was rotated at a speed of 60 RPM. The calculated deposition rate was 0.4 Å/sec, based on a previously made experimental calibration curve of CuO deposition time as a function of AFM measured thickness of the deposited CuO. One high purity fused silica sample and one $CaF_2$ sample were thus subjected for a deposition time of 12.5 seconds to deposit cupric oxide (CuO) having a calculated thickness of 0.5 nm directly onto the samples. The other sample of high purity fused silica was subjected for a deposition time of 25 seconds to deposit cupric oxide (CuO) having a calculated thickness of 1 nm.

The transmittance and reflectance as a function of wavelength of electromagnetic radiation for the high purity fused silica sample alone and the high purity fused silica sample with the 0.5 nm thick cupric oxide (CuO) were then measured using a spectrophotometer (Pelkin Elmer LAMBDA 950) (left side graphs up to 1.5 µm wavelength) and a Fourier-transform infrared spectrometer (Bruker Trensor) (middle graphs up to 15 µm wavelength). Reflectance for purposes of this disclosure was determined at an incidence angle of 16 degrees when using the Pelkin Elmer LAMBDA 950, and at an incidence angle of 10 degrees when using the Bruker Trensor spectrometer. Absorbance as a function of wavelength was then calculated (i.e., Absorbance=100−Transmittance−Reflectance). The measurements are set forth in the graphs reproduced at FIG. 7A. Analysis of the graphs at FIG. 7A reveals that the 0.5 nm thick cupric oxide (CuO) negligibly effects transmittance or reflectance compared to the high purity fused silica alone at wavelengths of electromagnetic radiation above 450 nm. The 0.5 nm thick cupric oxide (CuO) does slightly (2% or less) absorb electromagnetic radiation throughout the wavelength range of 250 nm to 450 nm, with absorbance increasing as wavelength of electromagnetic radiation decreases.

The transmittance and reflectance as a function of wavelength of electromagnetic radiation in the ultraviolet and visible spectrums for the high purity fused silica sample with the 1 nm thick layer of cupric oxide (CuO) were then measured. The measurements are set forth in the graphs reproduced at FIG. 7B, with data for the control sample (i.e., the high purity fused silica alone) and the sample with the 0.5 nm thick cupric oxide (CuO) added for comparison. In short, transmittance decreases as the thickness of the layer of cupric oxide (CuO) increases. The transmittance of the sample of high purity fused silica alone was over 90% throughout the entire wavelength range of 250 nm to 800 nm. The deposition of the cupric oxide (CuO) having thicknesses of 0.5 nm and 1 nm had a negligible impact on transmittance throughout the wavelength range of 550 nm to 800 nm. The transmittance of the sample with the cupric oxide (CuO) having a thickness of 0.5 nm was over 90% throughout the wavelength range of 300 nm to 800 nm. The transmittance of the sample with the cupric oxide (CuO) having a thickness of 1.0 nm was over 90% throughout the narrower wavelength range of 350 nm to 800 nm. The reflectance of the samples with the cupric oxide (CuO) was essentially the same as the reflectance of the sample without any such cupric oxide (CuO)—showing that the cupric oxide (CuO) primarily absorbs rather than reflects throughout the wavelength range utilized for the measurements (because optical power that is neither transmitted nor reflected must be absorbed).

Note that a small change in thickness of the cupric oxide (CuO) can drastically affect transmittance of the sample. By using a target of cupric oxide (CuO) to deposit the cupric oxide (CuO), cupric oxide (CuO) thicknesses of 1.3 nm or less, or 1 nm or less, can be achieved, which generally maintain the transmittance of the body (e.g., high purity fused silica) upon which the cupric oxide (CuO) is deposited. Alternatively, using a target of metallic copper(Cu) to form a layer of metallic copper (Cu) on the body and then subsequently oxidizing an exposed portion of the layer of metallic copper (Cu) into cupric oxide (CuO) would result in a much thicker layer (greater than 1.3 nm) that would more appreciably decrease the transmittance of the resulting article compared to the body alone.

Figure 8:
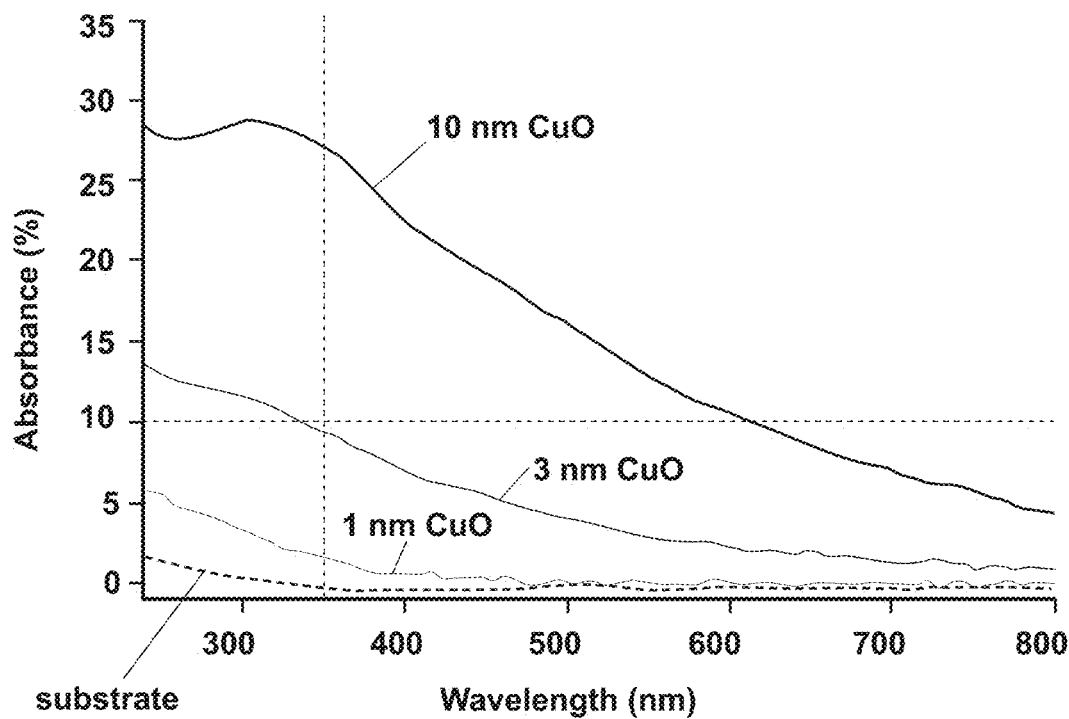
FIG. 8, pertaining to an Example 2 (of the article of FIGS. 1 and 2), reproduces two graphs— (i) a top graph of absorbance of the article as a function of wavelength and thickness of the cupric oxide (CuO), illustrating that the absorbance of the article increases as thickness of cupric oxide (CuO) increases, and (ii) a bottom graph, which is an X-ray photoelectron spectroscopy spectra for the cupric oxide (CuO) deposited on the article according to the disclosure, illustrating signals that are characteristic of cupric oxide (CuO) and not metallic copper (Cu) or cuprous oxide ($Cu_2O$)
Figure 8:
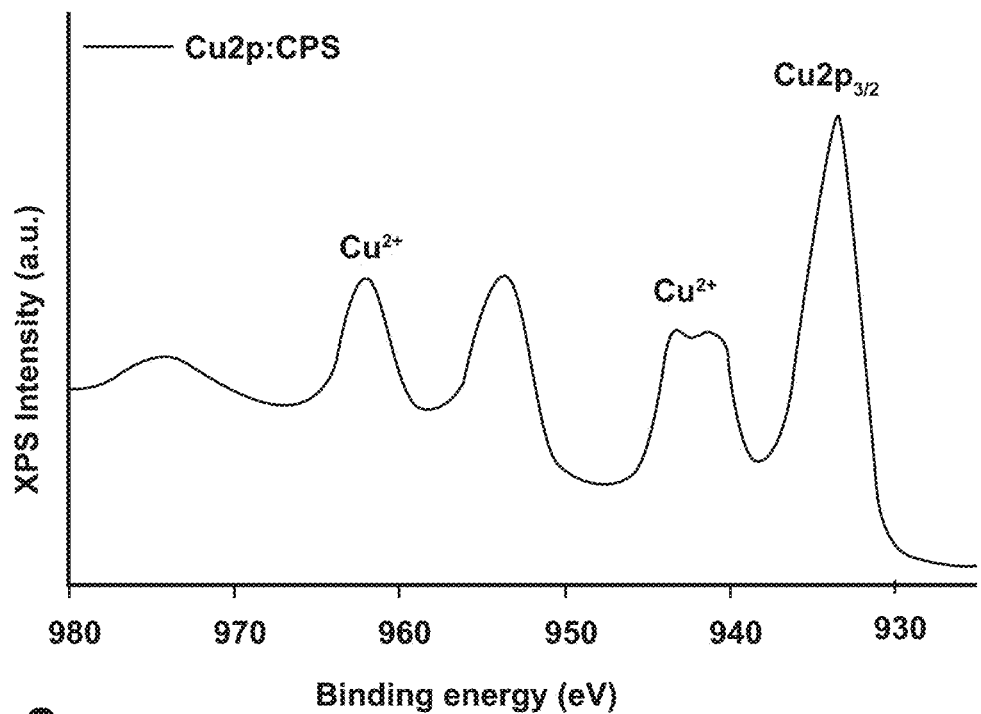

Example 2—In Example 2, and in reference to FIG. 8, cupric oxide (CuO) was applied directly onto three samples of high purity fused silica and one sample of $CaF_2$ via RF magnetron sputtering in the same manner as Example 1. Cupric oxide (CuO) having thicknesses of 1 nm, 3 nm, and 10 nm were separately applied to the three high purity fused silica samples. Cupric oxide (CuO) having a thickness of 3 nm was applied to the sample of $CaF_2$.

The transmittance and reflectance for each of the three samples of high purity fused silica with the cupric oxide (CuO) having varying thicknesses were then measured in the same manner as Example 1, and the absorbance calculated and graphed, as set forth in the top graph reproduced at FIG. 8. As the absorbance graph reveals, the sample with the cupric oxide (CuO) having a thickness of 1 nm demonstrated very little absorbance compared to the sample without cupric oxide (CuO), even at ultraviolet spectrum wavelengths within a range of 250 nm to 350 nm. Throughout the wavelength range of 350 nm to 800 nm, the absorbance of the sample with the cupric oxide (CuO) was only slightly higher than the absorbance of the sample alone without the cupric oxide (CuO), and well under 5%.

However, the sample with the cupric oxide (CuO) having a thickness of 3 nm demonstrated appreciable absorbance throughout the visible spectrum, and about 10% or higher absorbance at wavelengths of electromagnetic radiation shorter than 350 nm (e.g., 250 nm to 350 nm). The sample with the cupric oxide (CuO) having a thickness of 10 nm demonstrated even more absorbance than the sample with the 3 nm thick cupric oxide (CuO) throughout all wavelengths on the graph. The sample with the 10 nm thick cupric oxide (CuO) demonstrated absorbance of over 10% throughout the wavelength range of 250 nm to about 600 nm. The samples of Example 2 again show that nanometer-sized changes in the thickness of the cupric oxide (CuO) greatly affect the transmittance of the sample, primarily through increased absorbance as the thickness of the cupric oxide (CuO) increases. In short, the thinner the cupric oxide (CuO), the less able the cupric oxide (CuO) is to absorb optical power and the more optical power the cupric oxide (CuO) will transmit.

An X-ray photoelectron spectroscopy measurement was then conducted on the sample of $CaF_2$ with the 3 nm thick cupric oxide (CuO) to verify the chemical composition. The result is the graph reproduced at the bottom of FIG. 8. The spectra is characteristic of cupric oxide (CuO) as opposed to metallic copper (Cu) or cuprous oxide ($Cu_2O$), because $Cu^{2+}$ satellites appear at about 943 eV and 963 eV, and the primary $Cu_2p_{3/2}$ peak is at about 933.5 eV. XPS spectra of metallic copper (Cu) and cuprous oxide ($Cu_2O$) do not have such $Cu^{2+}$ satellites, and show just the two Culp peaks (also narrower and slightly shifted). Thus, the method described here does generate the layer of cupric oxide (CuO) and not metallic copper (CuO) or cuprous oxide ($Cu_2O$).

Figure 9A:
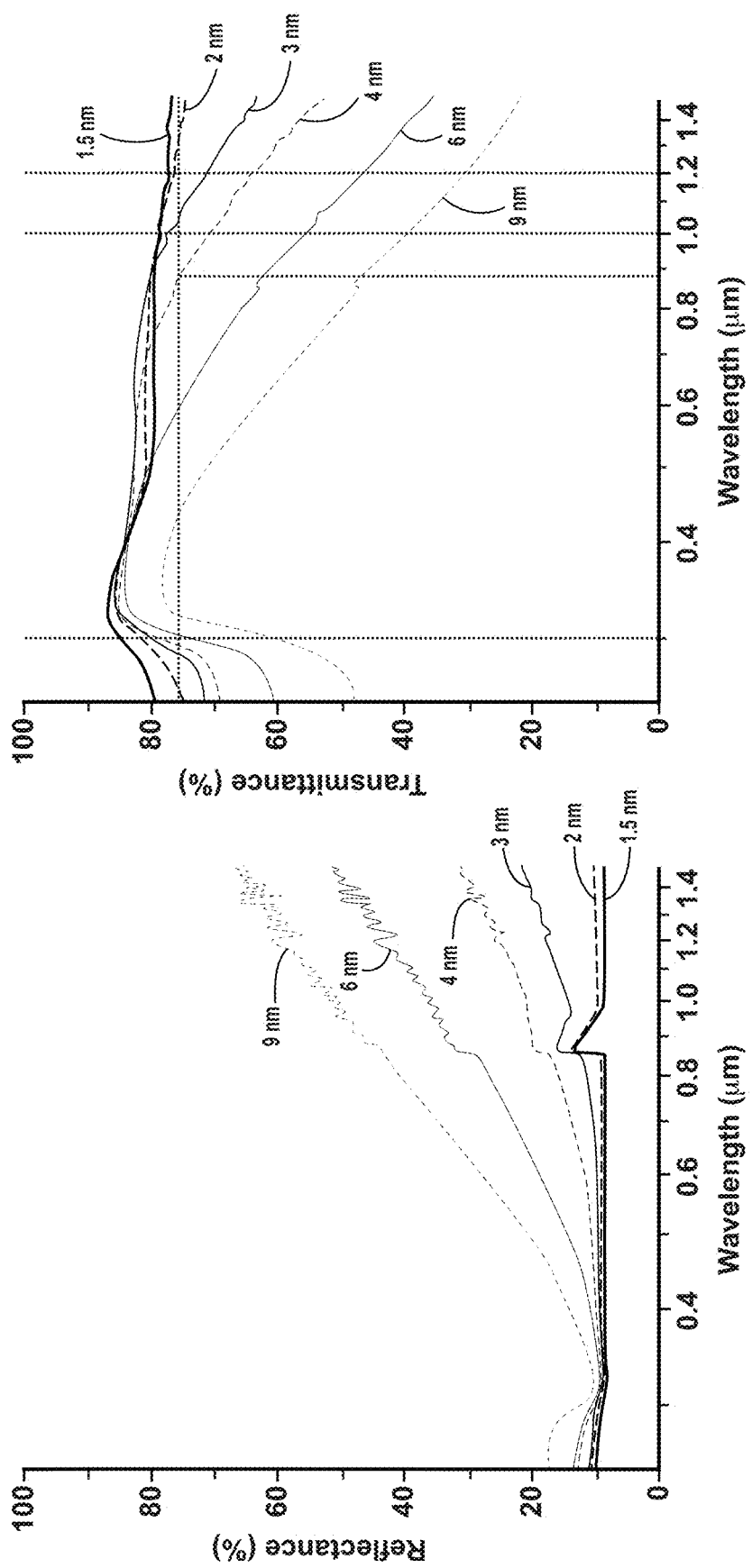
FIG. 9A, pertaining to an Example 3 (of the article of FIGS. 3 and 4), reproduces two graphs—(i) a left graph that plots reflectance of the article as a function of wavelength of electromagnetic radiation and thickness of an ultra-thin metal film of silver (Ag), illustrating that reflectance increases as thickness of the ultra-thin metal film increases, and (ii) a right graph that plots transmittance of the article as a function of wavelength of electromagnetic radiation and thickness of the ultra-thin metal film, illustrating that transmittance decreases as thickness of the ultra-thin metal film increases but remains high for thicknesses less than or equal to 2 nm.
Figure 9B:
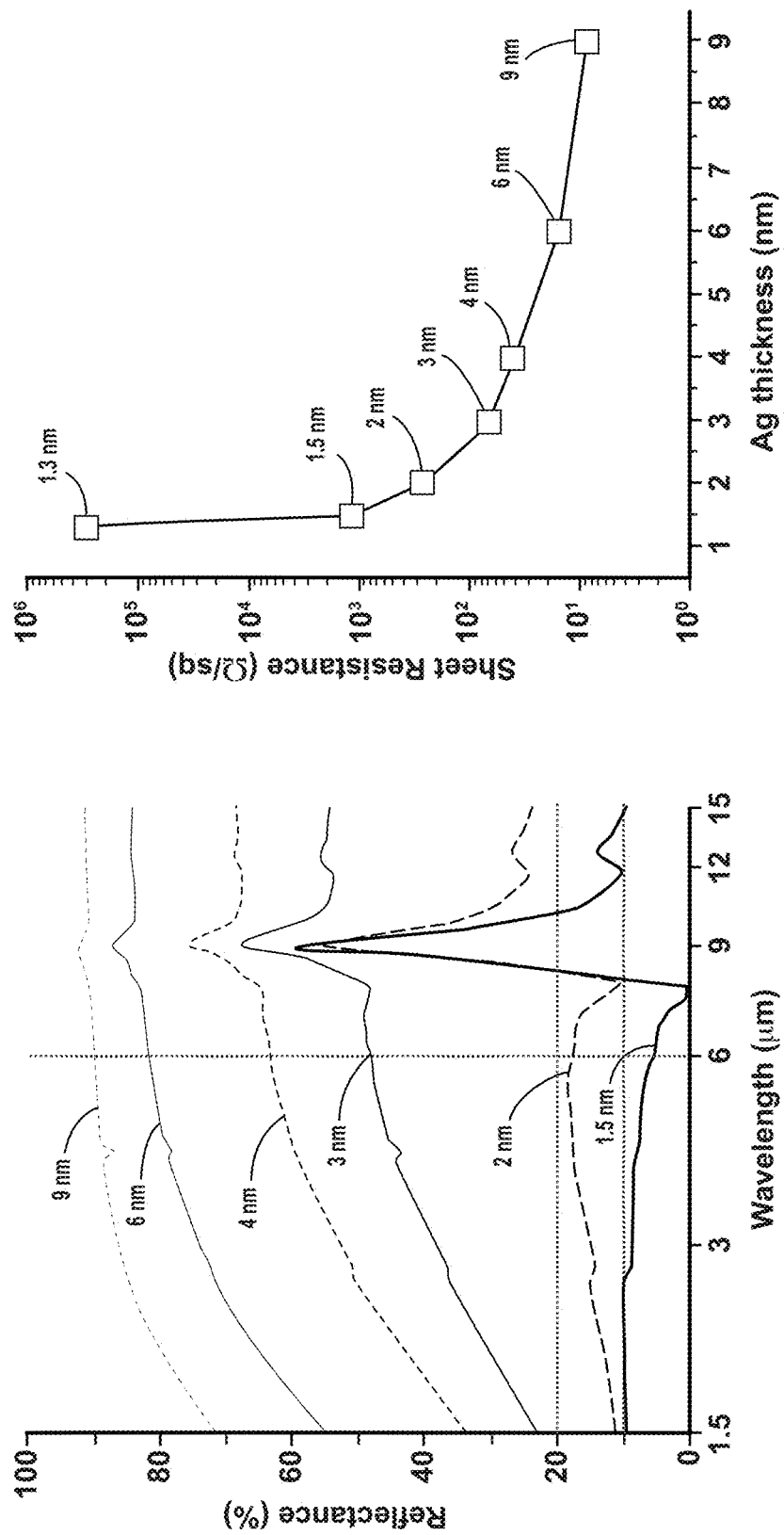
FIG. 9B, still pertaining to the Example 3, reproduces two graphs—(i) a left graph that plots reflectance of the article as a function of wavelength of electromagnetic radiation (in the infrared range) and thickness of the ultra-thin metal film of silver (Ag), illustrating that reflectance increases as thickness of the ultra-thin metal film increases but remains low for thicknesses of 2 nm or less, and (ii) a right graph that plots sheet resistance as a function of thickness of the ultra-thin metal film, illustrating that the article is electrically conductive with a 1.3 nm thick ultra-thin metal film of silver (Ag) and increases in electrical conductivity as thickness of the ultra-thin metal film increases.
Figure 9C:
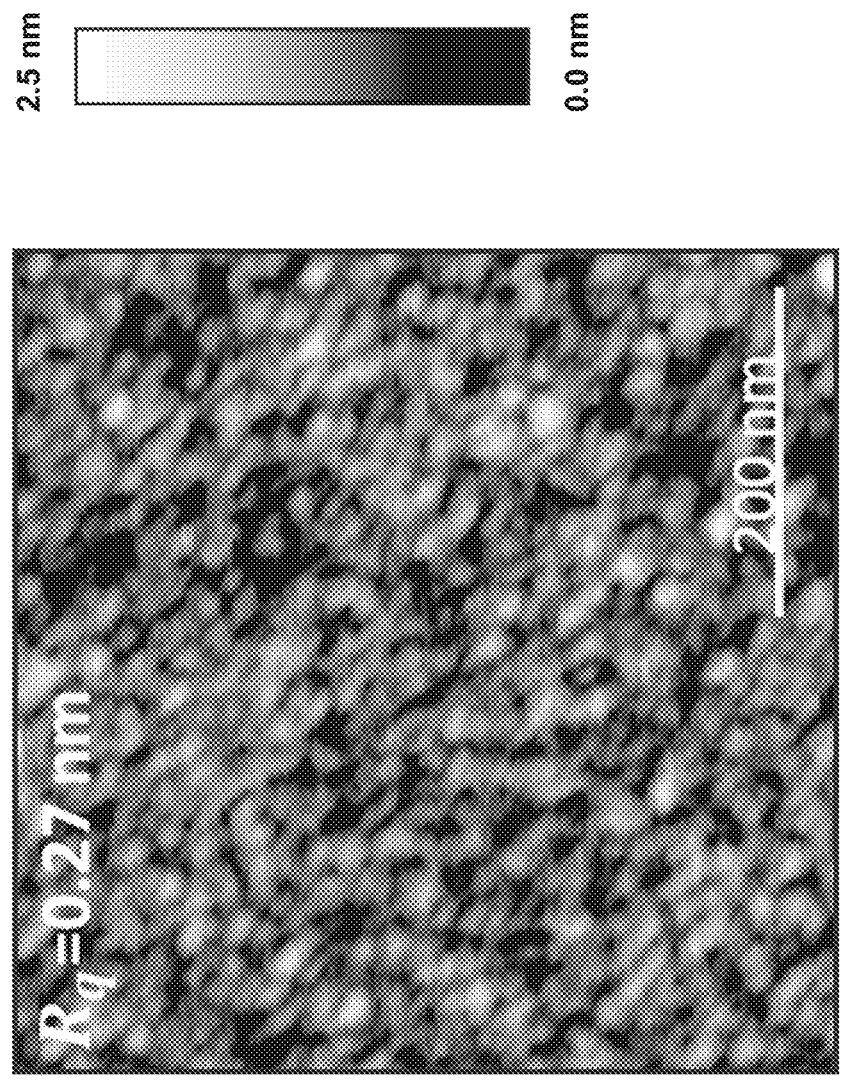
FIG. 9C, pertaining to the Example 3, is an atomic force microscope image of the surface morphology of a 4 nm thick ultra-thin metal film of silver (Ag), illustrating a surface roughness ($R_q$) of 0.27 nm.

Example 3—In Example 3 and in reference to FIGS. 9A-9C, seven samples of the same fused silica as used in Example 1 were prepared. Cupric oxide (CuO) having a thickness of 0.5 nm was then applied over five of the samples via RF magnetron sputtering using a target of 99.7 wt % to 99.9 wt % pure cupric oxide (CuO) in the same manner as set forth in Example 1.

Silver (Ag) was then deposited as an ultra-thin metal film on each sample over the cupric oxide (CuO) via RF magnetron sputtering (2 mTorr, Ar flux 20 sccm, DC power source 100 W) in the same sputtering chamber used to apply the cupric oxide (CuO). The target was 99% pure silver (Ag). The deposition rate of silver (Ag) was estimated to be 3.3 Å/second by correlating film thickness measured via atomic force microscopy ("AFM") as a function of deposition time. A different thickness of silver (Ag) was deposited on each sample. Specifically, the thicknesses of the ultra-thin metal thin film of silver were calculated (based on deposition time) to be 1.3 nm, 1.5 nm, 2 nm, 3 nm, 4 nm, 6 nm, and 9 nm. The calculated thickness of the ultra-thin metal film of silver of 4 nm was generally verified with AFM. Specifically, the combined thickness of the ultra-thin metal film of silver and the cupric oxide (CuO) was measured via AFM to be 4.75±0.09 nm, meaning that the thickness of the ultra-thin metal film of silver was about 4.25 nm, if the thickness of the cupric oxide (CuO) was 0.5 nm.

The reflectance and transmittance for each sample (except the sample with 1.3 nm thick UTMF of silver) as a function of wavelength of electromagnetic radiation generally within the ultraviolet and visible ranges were then measured in the same manner as Example 1. The graphs of the measurements are set forth in the two graphs reproduced at FIG. 9A. The reflectance graph reveals that the reflectance increases as a function of increasing thickness of the ultra-thin metal film of silver. The transmittance graph reveals that transmittance decreases as the thickness of the ultra-thin metal film of silver increases. The sample with the 1.5 nm thick ultra-thin metal film of silver demonstrated a transmittance greater than or equal to 75% throughout the wavelength range of 300 nm to 1400 nm (and beyond). The sample with the 2 nm thick ultra-thin film of silver demonstrated a transmittance greater than or equal to 75% throughout the wavelength range of 300 nm to 1200 nm. The sample with the 3 nm thick ultra-thin film of silver demonstrated a transmittance greater than or equal to 75% throughout the wavelength range of 300 nm to 1000 nm (and a bit beyond). The samples with 4 nm, 6 nm, and 9 nm thick ultra-thin films of silver demonstrated transmittances greater than or equal to 75% only throughout the wavelength ranges of about 300 nm to about 900 nm, about 310 nm to about 600 nm, and about 310 to about 450 nm, respectively. Like with the cupric oxide (CuO), nanometer-sized changes to the thickness of the ultra-thin metal film of film greatly affect the transmittance of the sample.

The reflectance of each sample (except the sample with 1.3 nm thick UTMF of silver) as a function of wavelength within the infrared range was then measured with a Fourier-transform infrared spectrometer (BrukerTrensor). The measurements are set forth in the left graph reproduced at FIG. 9B. Again, the reflectance of the sample increases as thickness of the ultra-thin metal film of silver (Ag) increases. The 9 nm thick ultra-thin metal film of silver demonstrates near perfect reflectance at wavelengths greater than or equal to 6 μm. The sample with the 2 nm thick ultra-thin metal film of silver demonstrated reflectance of less than 20 percent throughout the wavelength range of 1 μm to 6 μm (and longer). The sample with the 1.5 nm thick ultra-thin metal film of silver demonstrated reflectance of less than or equal to 10 percent throughout the wavelength range of 1 μm to 6 μm (and longer).

The sheet resistance for each thickness of the ultra-thin metal film of silver was measured and plotted on the graph reproduced at the right of FIG. 9B. The sheet resistance was measured using the four-point method with a Cascade Microtech 44/7 S 2740 probe station connected to a Keithley 2001 multimeter. The sheet resistance was measured with three different samples of each thickness, using four measurements on each sample, and then averaged. Each sample was fabricated separately via RF magnetron sputtering. The results are set forth in the Table 1 below.

TABLE 1

| Ag Thickness (nm) | Sheet Resistance (Ω/□) |
| --- | --- |
| 9 | 8.5 ± 0.4 |
| 6 | 15.3 ± 0.4 |
| 4 | 40 ± 3 |
| 3 | 66 ± 2 |
| 2 | 260 ± 30 |
| 1.5 | 1100 ± 90 |
| 1.3 | 2.95E5 ± 1.8E5 |

The number after the "±" in the Table 1 above is the standard deviation. As Table 1 and associated graph at FIG. 9B reveals, the sheet resistance decreases (and thus electrical conductivity increases) as a function of increasing thickness of the ultra-thin metal film of silver. The sample with the 1.3 nm thick ultra-thin metal film was nevertheless electrically conductive (there being a measurable sheet resistance). The sample with the 3 nm thick ultra-thin metal film had a sheet resistance of under 100Ω/□ (i.e., 66±2Ω/□). The samples with the 1.5 nm and 2 nm thick ultra-thin metal films had sheet resistances between 200Ω/□ and 1300Ω/□ (i.e., 1100±90Ω/□ and 260±30Ω/□, respectively).

The surface roughness and the total thickness of the cupric oxide (CuO) and the ultra-thin metal film of silver (Ag) of the sample with the 4 nm thick ultra-thin metal film of silver were also measured with an atomic force microscope (Park NX20 AFM system). The surface roughness was measured with a lateral resolution of <0.5 nm and calculated as root-mean-squared surface roughness ($R_q$). The surface roughness ($R_q$) for the sample was 0.27 nm. The total thickness of the cupric oxide (CuO) and the ultra-thin metal film of silver (Ag) of the sample was measured at 50 different profiles and with a lateral resolution of <10 nm and then averaged. The average thickness of the sample was 4.75 nm, with a standard deviation of 0.09 nm. An atomic force microscope image of the morphology of the sample is reproduced at FIG. 9C.

The 1.3 nm thick ultra-thin metal film of silver (Ag) demonstrating electrical conductivity demonstrates that the cupric oxide (CuO) having a thickness of 1 nm or less drastically lowers the percolation threshold of the ultra-thin metal film of silver (Ag) and presumably other noble metals. Thus, the cupric oxide (CuO) having a thickness of 1 nm or less allows for thinner ultra-thin metal films of noble metals, which still provide electrical conductivity but with greater transmittance.

Figure 10A:
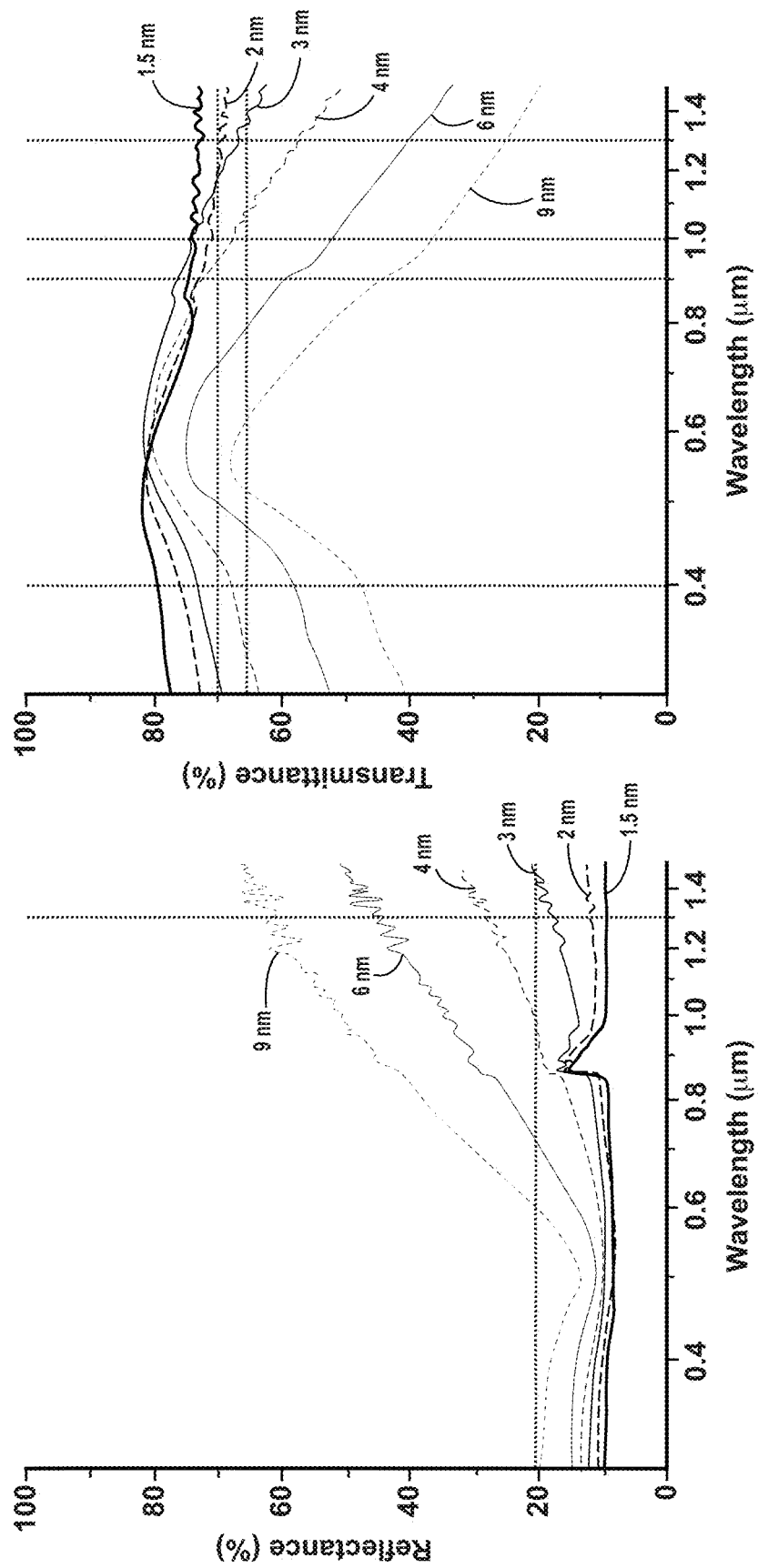
FIG. 10A, pertaining to an Example 4 (of the article of FIGS. 3 and 4), reproduces two graphs—(i) a left graph that plots reflectance of the article as a function of wavelength of electromagnetic radiation and thickness of an ultra-thin metal film of gold (Au), illustrating that reflectance increases as thickness of the ultra-thin metal film increases, and (ii) a right graph that plots transmittance of the article as a function of wavelength of electromagnetic radiation and thickness of the ultra-thin metal film, illustrating that transmittance decreases as thickness of the ultra-thin metal film increases but remains high for thicknesses less than or equal to 2 nm.
Figure 10B:
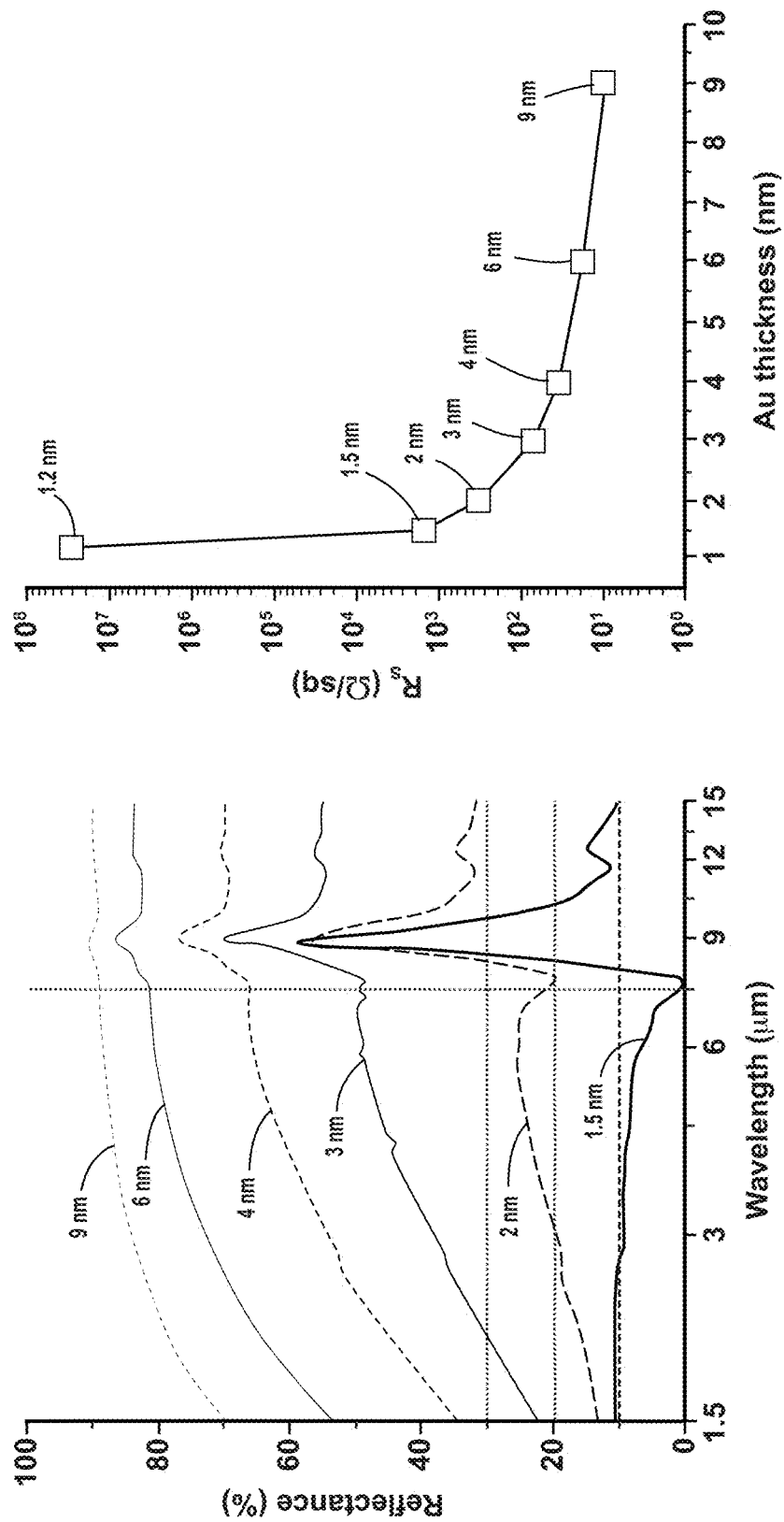
FIG. 10B, still pertaining to the Example 4, reproduces two graphs—(i) a left graph that plots reflectance of the article as a function of wavelength of electromagnetic radiation (in the infrared range) and thickness of the ultra-thin metal film of gold (Au), illustrating that reflectance increases as thickness of the ultra-thin metal film increases but remains low for thicknesses less than or equal to 2 nm, and (ii) a right graph that plots sheet resistance as a function of thickness of the ultra-thin metal film, illustrating that the article is electrically conductive with a 1.2 nm thick ultra-thin metal film of gold (Au) and increases in electrical conductivity as thickness of the ultra-thin metal film increases.
Figure 10C:
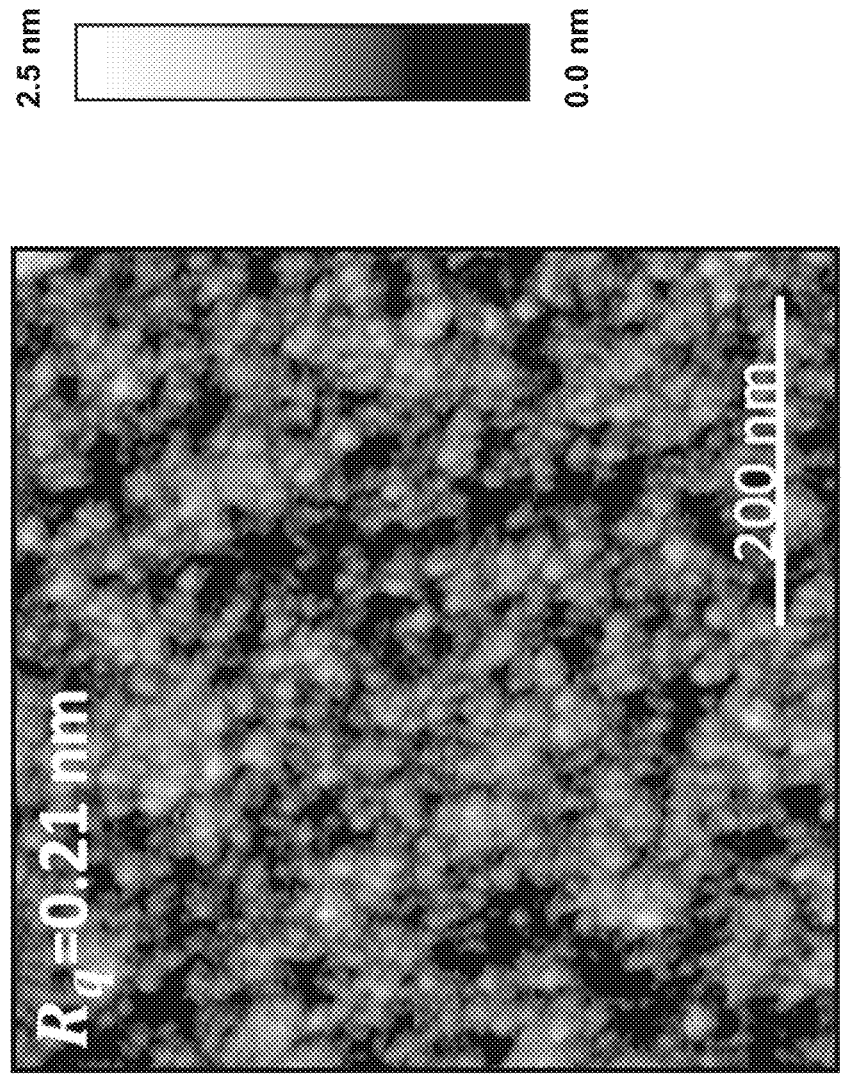
FIG. 10C, pertaining to the Example 4, is an atomic force microscope image of the surface morphology of a 4 nm thick ultra-thin metal film of gold (Au), illustrating a surface roughness ($R_q$) of 0.21 nm.

Example 4—In Example 4, and in reference to FIGS. 10A-10C, seven samples of fused silica were prepared. Cupric oxide (CuO) having a thickness of 0.5 nm was then applied over three of the samples via RF magnetron sputtering using a target of 99.7 wt % to 99.9 wt % pure cupric oxide (CuO), via the same process set forth at Example 1.

Each sample was immediately transferred to a different vacuum chamber. The short duration that each sample was exposed to atmospheric oxygen was thought to be inconsequential because the cupric oxide (CuO) is already oxygen-rich. Gold (Au) was then deposited as an ultra-thin metal film over the cupric oxide (CuO) via thermal evaporation. Each sample received a different thickness of gold (Au). The gold (Au) thermal evaporation rate was 1 Å/second measured in-situ by a quartz crystal microbalance. The calculated thicknesses of the ultra-thin metal thin film of gold (Au) based on deposition time were 1.2 nm, 1.5 nm, 2 nm, 3 nm, 4 nm, 6 nm, and 9 nm. The calculated thickness of the ultra-thin metal film of gold of 4 nm was generally verified with AFM. Specifically, the combined thickness of the ultra-thin metal film of gold and the cupric oxide (CuO) was measured via AFM to be 4.51±0.05 nm, meaning that the thickness of the ultra-thin metal film of gold was about 4.01 nm, if the thickness of the cupric oxide (CuO) was 0.5 nm.

The reflectance and transmittance for each sample as a function of wavelength of electromagnetic radiation generally within the ultraviolet and visible spectrums were then measured in the same manner as Example 1. The graphs of the measurements are set forth in the two graphs reproduced at FIG. 10A. The reflectance graph (on the left) reveals that the reflectance increases as a function of increasing thickness of the ultra-thin metal film of gold. The samples with the 1.5 and 2 nm thick ultra-thin metal film of gold had a reflectance of less than 20% throughout the wavelength range of 300 nm to 1500 nm. The sample with the 3 nm thick ultra-thin metal film of gold had a reflectance of less than 20% throughout the wavelength range of 300 nm to at least 1300 nm.

The transmittance graph (on the right of FIG. 10A) reveals that transmittance decreases as the thickness of the ultra-thin metal film of gold increases. The sample with the 1.5 nm thick ultra-thin metal film of gold demonstrated a transmittance greater than or equal to 70% throughout the wavelength range of 300 nm to 1400 nm (and beyond). The sample with the 2 nm ultra-thin metal film of gold demonstrated a transmittance greater than or equal to 65% throughout the wavelength range of 300 nm to 1400 nm (and beyond). The sample with the 3 nm ultra-thin metal film of gold demonstrated a transmittance greater than or equal to 65% throughout the wavelength range of 300 nm to 1300 nm. The samples with the 1.5 nm thick and 2 nm ultra-thin metal film of gold demonstrated a transmittance greater than or equal to 70% throughout the wavelength range of 300 nm to 1000 nm. The sample with the 4 nm thick ultra-thick film of gold demonstrated a transmittance greater than or equal to 65% throughout the wavelength range of 400 nm to 1000 nm. The sample with the 6 nm thick ultra-thin film of gold demonstrated a transmittance greater than or equal to 70% only through the wavelength range of about 500 nm to less than 700 nm. The sample with the 9 nm thick ultra-thin film of silver demonstrated a transmittance greater than or equal to 65% only through the wavelength range of about 500 nm to about 650 nm. Like with the cupric oxide (CuO), nanometer-sized changes to the thickness of the ultra-thin metal film of film greatly affect the transmittance of the sample.

The reflectance of each sample as a function of wavelength within the infrared range was then measured in the same manner as Example 3. The measurements are set forth in the left graph reproduced at FIG. 10B. Again, the reflectance of the sample increases as thickness of the ultra-thin metal film of gold (Au) increases. The 9 nm thick ultra-thin metal film of gold demonstrates near perfect reflectance of wavelengths greater than or equal to 6 μm. The samples with the 1.5 nm thick ultra-thin metal film of gold demonstrated reflectance of less than 20 percent throughout the wavelength range of 1 μm to 7.5 μm (and longer). The samples with the 2.0 nm thick ultra-thin metal film of gold demonstrated reflectance of less than 30 percent throughout the wavelength range of 1 μm to 7.5 μm (and longer). The sample with the 1.5 nm thick ultra-thin metal film of gold demonstrated reflectance of less than or equal to 10 percent throughout the wavelength range of 3 μm to 7.5 μm (and longer).

The sheet resistance for each sample at the ultra-thin metal film of gold was measured (in the same manner as in Example 3). The measured values are set forth in the Table 2 below and plotted on the graph reproduced at the right of FIG. 10B.

TABLE 2

| Au Thickness (nm) | Sheet Resistance (Ω/□) |
| --- | --- |
| 9 | 9.8 ± 0.7 |
| 6 | 17.2 ± 0.6 |
| 4 | 35.4 ± 1.3 |
| 3 | 68.2 ± 1.0 |
| 2 | 320 ± 30 |
| 1.5 | 1900 ± 200 |
| 1.2 | 1.5E7 ± 0.8E7 |

As Table 2 and associated graph of FIG. 10B reveals, the sheet resistance decreases (and thus electrical conductivity increases) as a function of increasing thickness of the ultra-thin metal film of gold. The sample with the 1.2 nm thick ultra-thin metal film was nevertheless electrically conductive (there being a measurable sheet resistance). The sample with the 3 nm thick ultra-thin metal film had a sheet resistance of under 100Ω/□ (i.e., 68.2Ω/□). The samples with the 1.5 nm and 2 nm thick ultra-thin metal films had sheet resistances less than 2100Ω/□, and between 250Ω/□ and 2100Ω/□ (i.e., 1900Ω/□ and 320Ω/□, respectively).

The 1.2 nm thick ultra-thin metal film of gold (Au) demonstrating electrical conductivity demonstrates that the cupric oxide (CuO) having a thickness of 1 nm or less drastically lowers the percolation threshold of the ultra-thin metal film of gold (Au) and presumably other noble metals.

The surface roughness and the total thickness of the layer of cupric oxide (CuO) and the ultra-thin metal film of silver (Au) of the sample with the 4 nm thick ultra-thin metal film of gold were also measured. The surface roughness was measured and calculated as root-mean-squared surface roughness ($R_q$), and $R_q$ for the sample was 0.21 nm. The total thickness of the cupric oxide (CuO) and the ultra-thin metal film of gold (Au) of the sample were measured at 50 different profiles, with an average thickness of 4.51 nm and a standard deviation of 0.05 nm. An atomic force microscope image of the morphology of the sample is reproduced at FIG. 10C.

Example 5—Example 5 demonstrates application of the articles described herein, with an ultra-thin metal film of gold (Au) disposed on cupric oxide (CuO), as an infrared mirror. To form the infrared mirror, a sample of $CaF_2$ was selected. A first layer of cupric oxide (CuO) and another layer of cupric oxide (CuO) not connected to the first layer of cupric oxide (CuO), each having a thickness of 0.5 nm, were disposed on the $CaF_2$ substrate in the manner set forth at Example 1. An ultra-thin metal film of gold, having a thickness of 3 nm, was then disposed on the first layer of cupric oxide (CuO) in the manner set forth at Example 4. A second layer of gold (Au), not connected to the ultra-thin metal film of gold (Au) was disposed on the other layer of cupric oxide (CuO) in the same manner.

Figure 11:
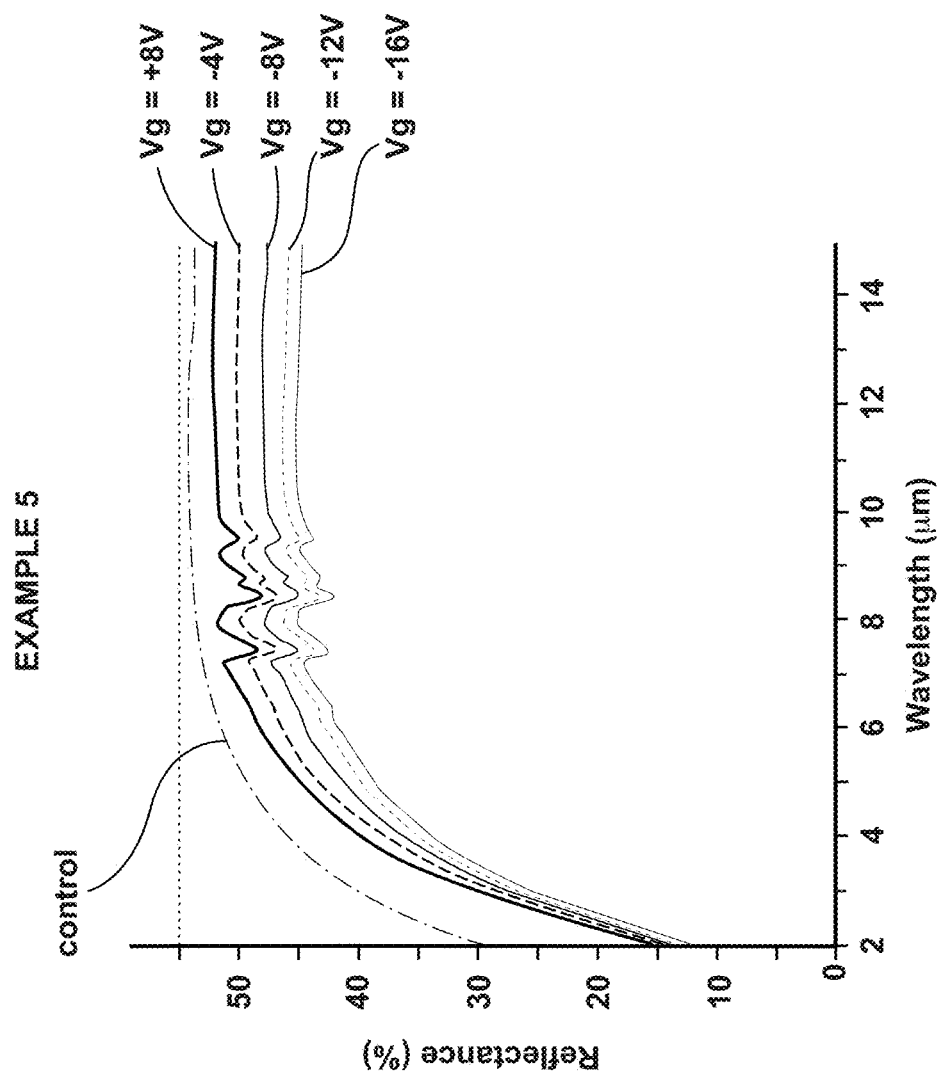
FIG. 11, pertaining to an Example 5, is a graph of measured reflectance as a function of wavelength of electromagnetic radiation and gate voltage applied to an embodiment of the article of FIG. 6A, illustrating that maximum reflectance of the article (at the ultra-thin metal film) generally decreased as applied voltage decreased.

The reflectance of the infrared mirror was then measured as a function of wavelength of electromagnetic radiation in the infrared spectrum. A graph of the results is reproduced at FIG. 11. The line identified as "control" represents the infrared mirror as formed, and reveals a peak reflectance of about 54% for wavelengths of about 11 µm.

An electrically conductive ionic gel was prepared. More specifically, by weight, 9.6% EMIM-TFSI as the ionic liquid, 0.4% PS-PEO-PS triblock copolymer as the polymer matrix, and 90% acetonitrile as the solvent were mixed together via magnetic stirring in a glove box thus forming the ionic gel. The ionic gel was then spin-coated over the sample at 4000 rpm for 40 seconds and then dried in a low pressure atmosphere for 2 hours. The ionic gel was thus contiguously disposed over both the ultra-thin metal film of gold (Au) and the second layer of gold (Au). The thickness of the layer of the electrically conductive ion gel was about 140 nm.

Varying gate voltages were then applied to the infrared mirror, and the reflectance of the infrared mirror was again measured as a function of both the applied voltage and the wavelength of electromagnetic radiation. The applied gate voltages (Vg) ranged from +8 V to −16 V, in increments of 2 V. The results for select voltages are also set forth in the graph reproduced at FIG. 11. When the gate voltage applied was +8 V, the maximum reflectance of the infrared mirror was about 51% at a wavelength of about 11 µm. When the gate voltage applied was −16 V, the maximum reflectance of the infrared mirror was about 45% again at a wavelength of about 11 µm. The difference in the maximum reflectance as a function of voltage corresponds to a modulation of about 11% (i.e., (Reflectance$_{+8V}$−Reflectance$_{-16V}$)/Reflectance$_{control}$=~11%). The infrared mirror exhibited a relatively large hysteresis and response time because the relatively thin layer of the electrically conductive ionic gel slowed ion mobility.

Increasing the thickness of the electrically conductive ionic gel would increase ion mobility and thus decrease hysteresis and response time but at the expense of reflectance. The perturbations in the reflectance of the infrared mirror as a function of wavelengths throughout the range of about 7 µm to about 10 µm illustrate the impact of the optical properties of the layer of the electrically conductive ionic gel have on the infrared mirror.

Example 6—Example 6 demonstrates application of the articles described herein, with an ultra-thin metal film of gold (Au) in the form of a grating (nano-ribbon array) disposed on cupric oxide (CuO), as a resonant plasmonic structure. To form the resonant plasmonic structure, a sample of $CaF_2$ was selected. The area of the sample where the grating was desired was primed with hexamethyldisilazane (HMDS), which is adhesion promotor for photoresist materials. The photoresist AZ nLOF 2020 (MicroChemicals GmbH) was then coated onto the HMDS. The photoresist was then exposed to light to reproduce the pattern desired for the grating.

A first layer of cupric oxide (CuO) and another layer of cupric oxide (CuO) not connected to the first layer of cupric oxide (CuO), each having a thickness of 0.5 nm, were disposed on the $CaF_2$ body in the manner set forth at Example 1. The first layer of cupric oxide (CuO) was disposed on the area of the $CaF_2$ body that included the exposed photoresist. An ultra-thin metal film of gold, having a thickness of 3 nm, was then disposed on the first layer of cupric oxide (CuO) in the manner set forth at Example 4. A second layer of gold (Au), separated from the ultra-thin metal film of gold (Au), was disposed on the other layer of cupric oxide (CuO) in the same manner. The resulting article was then developed in acetone to dissolve the unexposed photoresist and allow the separation of portions of the first layer of cupric oxide (CuO) and the ultra-thin metal film of gold on such unexposed photoresist. The remaining portion of the first layer of cupric oxide (CuO) and the ultra-thin metal film of gold over the exposed photoresist took the form of the grating (nano-ribbon array) with spaced ribbons. Each of the spaced ribbons had a width of 820 nm and were spaced with a period of 1380 nm.

Figure 12:
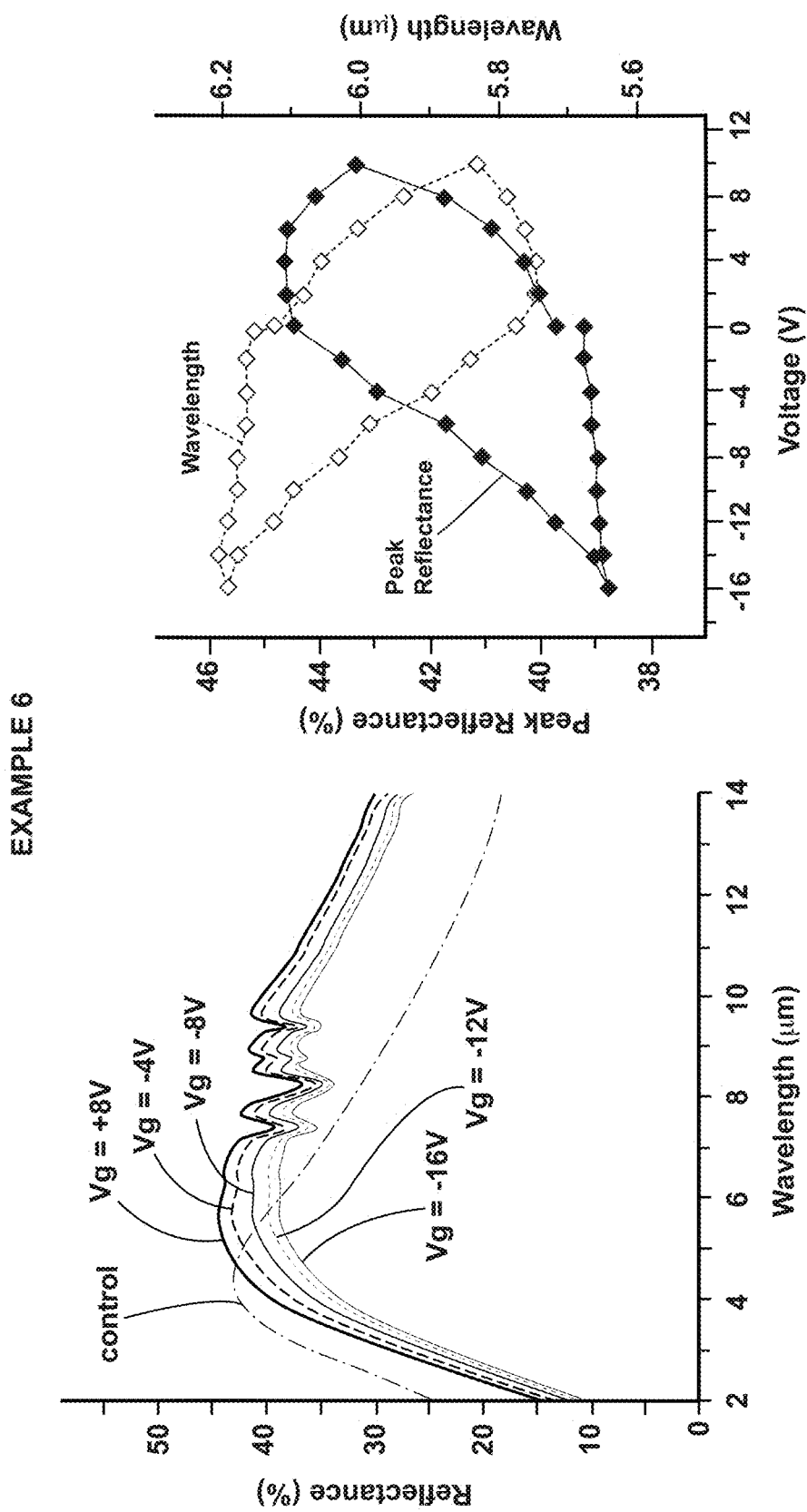
FIG. 12, pertaining to an Example 6, reproduces a first graph (on the left) of measured reflectance as a function of wavelength of electromagnetic radiation and gate voltage applied to an embodiment of the article of FIG. 6C, and a second graph (on the right) of both measured maximum reflectance and the wavelength at which the maximum reflectance occurred as a function of the gate voltage applied, illustrating that maximum reflectance of the article (at spaced parallel ribbons of the ultra-thin metal film) generally decreased as applied voltage decreased, and that the wavelength at which the maximum reflectance occurred generally increased as voltage applied increased.

The reflectance of the resonant plasmonic structure at the spaced parallel ribbons of the ultra-thin metal film of gold (Au) was then measured as a function of wavelength of electromagnetic radiation in the infrared spectrum. A graph of the results is reproduced at FIG. 12 (left figure). The line identified as "control" represents the resonant plasmonic structure as formed, and reveals a peak reflectance of about 42% at a wavelength of about 4.2 µm. A Fourier-transform infrared microscope (Bruker Hyperion 2000) was utilized to measure reflectance.

A layer of an electrically conductive ionic gel was then contiguously disposed over both the ultra-thin metal film of gold (Au) with the spaced ribbons and the second layer of gold (Au), in the manner set forth at Example 5.

Varying gate voltages were then applied to the spaced ribbons of the ultra-thin metal film of gold (Au), and the reflectance of the spaced ribbons of the ultra-thin metal film of gold (Au) was again measured as a function of both the applied voltage and the wavelength of electromagnetic radiation. The electromagnetic radiation was applied only to the spaced ribbons of the ultra-thin metal film of gold (Au) (and not the other second layer of gold (Au)) through use of a knife edge aperture. An infrared polarizer was used to select a linearly polarized electric field oriented transversally to the spaced parallel ribbons, to excite the plasmonic resonance of the spaced ribbons. The measurements were performed in a nitrogen-purged atmosphere.

The applied gate voltage was cycled from 0 V to 10 V in 2 V increments, then from 10 V to −16 V again in 2 V increments, and then from −16 V back to 0 V in 2 V increments. The reflectance was determined at each 2 V increment. The results for select voltages are also set forth in the graph reproduced at the left of FIG. 12. The graph on the right of FIG. 12 reveal that an applied voltage of 6 V produced the maximum peak reflectance of about 45% at a wavelength of about 5.75 μm. In addition, an applied voltage of −16 V produced the minimum peak reflectance of about 39% at a wavelength of about 6.21 μm. The results demonstrate that the applied voltage can be selected to modulate both the maximum reflectance and the wavelength at which the maximum reflectance occurs. The difference in the peak reflectance as a function of voltage corresponds to a modulation of about 14% (i.e., (Reflectance$_{+6V}$−Reflectance$_{-16V}$)/Reflectance$_{control}$=((~45%−~39%)/~42%)=~14%). The infrared mirror exhibited a relatively large hysteresis and response time because the relatively thin layer of the electrically conductive ionic gel slowed ion mobility. The difference of the wavelength at which the peak reflectance occurred as a function of voltage corresponds to a modulation of about 10.6% (i.e., (Wavelength$_{+6V}$−Wavelength$_{-16V}$)/Wavelength$_{control}$=((~5.75 μm−~6.21 μm)/~4.36 μm)=~10.6%).

The electrochemical effect and the dielectric properties of the electrically conductive ionic gel likely caused the shift in the wavelength at which reflectance was at a maximum. Again, the perturbations in the reflectance of the infrared mirror as a function of wavelengths throughout the range of about 7 μm to about 10 μm illustrates the impact of the optical properties of the layer of the electrically conductive ionic gel has on the resonant plasmonic structure. This demonstrates the high sensitivity of the resonant plasmonic structure to external medium changes involving charge transfer/electrochemical processes and its potential for surface-enhanced IR absorption (SEIRA) sensing.

What is claimed is:

1. An article comprising:
   a body, the body comprising a material and a transmittance greater than or equal to 90% throughout an electromagnetic radiation wavelength range of 250 nm to 800 nm, wherein the material of the body is an alkaline earth aluminosilicate glass, a borosilicate glass, calcium fluoride (CaF$_2$), magnesium fluoride (MgF$_2$), fused quartz, doped fused silica, undoped fused silica, or combinations thereof; and
   cupric oxide (CuO) in direct contact with the material of the body, the cupric oxide (CuO) comprising a thickness that is less than or equal to 1.0 nm.

2. The article of claim 1, wherein the thickness of the cupric oxide (CuO) is from 0.4 nm to 0.9 nm.

3. The article of claim 1, wherein the thickness of the cupric oxide (CuO) is within a range of 0.4 nm to 0.7 nm.

4. The article of claim 1, wherein the article is free of a layer of metallic copper (Cu) disposed between the cupric oxide (CuO) and the body.

5. The article of claim 1, wherein the article comprises a transmittance greater than or equal to 90% throughout an electromagnetic radiation wavelength range of 350 nm to 800 nm.

6. The article of claim 1 further comprising:
   an ultra-thin metal film disposed directly on the cupric oxide (CuO);
   wherein, the article comprises a transmittance greater than or equal to 65% throughout an electromagnetic radiation wavelength range of 300 nm to 1400 nm;
   wherein, the ultra-thin metal film comprises one or more of silver (Ag), gold (Au), copper (Cu), or platinum (Pt);
   wherein, the ultra-thin metal film comprises a thickness within a range of 1 nm to 5 nm; and
   wherein the article at the ultra-thin metal film has a sheet resistance of less than or equal to $10^8$ Ω/□, as measured with a probe station connected to a multimeter using a four-point method at four different sets of positions on the ultra-thin metal film and then averaged.

7. An article comprising:
   a body, a material of the body is an alkaline earth aluminosilicate glass, a borosilicate glass, calcium fluoride (CaF$_2$), magnesium fluoride (MgF$_2$), fused quartz, doped fused silica, undoped fused silica, or combinations thereof;
   cupric oxide (CuO) in direct contact with the material of the body, the cupric oxide (CuO) comprising a thickness that is less than or equal to 1.0 nm; and
   an ultra-thin metal film disposed directly on the cupric oxide (CuO), the ultra-thin metal film comprising a thickness within a range of 1 nm to 5 nm;
   wherein the article comprises a transmittance greater than or equal to 65% throughout an electromagnetic radiation wavelength range of 300 nm to 1400 nm; and
   wherein the article at the ultra-thin metal film has a sheet resistance of less than or equal to $10^8$ Ω/□, as measured with a probe station connected to a multimeter using a four-point method at four different sets of positions on the ultra-thin metal film and then averaged.

8. The article of claim 7, wherein the thickness of the cupric oxide (CuO) is from 0.4 nm to 0.9 nm.

9. The article of claim 7, wherein the thickness of the cupric oxide (CuO) is within a range of 0.4 nm to 0.7 nm.

10. The article of claim 7, wherein the ultra-thin metal film comprises one or more of silver (Ag), gold (Au), copper (Cu), or platinum (Pt).

11. The article of claim 7, wherein the ultra-thin metal film comprises one or more of silver (Ag) or gold (Au).

12. The article of claim 7, wherein the thickness of the ultra-thin metal film is from greater than or equal to 1 nm to less than or equal to 2 nm.

13. The article of claim 7, wherein
   the ultra-thin metal film comprises silver (Ag); and
   the transmittance of the article is greater than or equal to 75% throughout an electromagnetic radiation range of 300 nm to 1400 nm.

14. The article of claim 7, wherein
   the ultra-thin metal film comprises silver (Ag); and
   the transmittance of the article is greater than or equal to 75% throughout an electromagnetic radiation range of 300 nm to 1200 nm.

15. The article of claim 7, wherein
   the ultra-thin metal film comprises gold (Au); and
   the transmittance of the article is greater than or equal to 65% throughout an electromagnetic radiation range of 300 nm to 1400 nm.

16. The article of claim 7, wherein
   the ultra-thin metal film comprises gold (Au); and
   the transmittance of the article is greater than or equal to 70% throughout an electromagnetic radiation range of 300 nm to 1400 nm.

17. A method of manufacturing an article comprising:
   applying cupric oxide (CuO) onto a body via a physical vapor deposition technique, the body comprising a material, and thus forming an article with the cupric oxide (CuO) in direct contact with the material of the body;
   wherein, the cupric oxide (CuO) has a thickness that is less than or equal to 1.0 nm;

wherein, the article comprises a transmittance greater than or equal to 90% throughout an electromagnetic radiation wavelength range of 300 nm to 800 nm, and wherein the material of the body is an alkaline earth aluminosilicate glass, a borosilicate glass, calcium fluoride ($CaF_2$), magnesium fluoride ($MgF_2$), fused quartz, doped fused silica, undoped fused silica, or combinations thereof.

18. The method of claim 17 further comprising:

applying an ultra-thin metal film directly on the cupric oxide (CuO) via a physical vapor deposition or thermal evaporation technique, thus forming a new article;

wherein, the ultra-thin metal film comprises one or more of silver (Ag), gold (Au), copper (Cu), or platinum (Pt);

wherein, the new article at the ultra-thin metal film has a sheet resistance of less than or equal to 2100 $\Omega/\square$, as measured with a probe station connected to a multimeter using a four-point method at four different sets of positions on the ultra-thin metal film and then averaged; and wherein the new article comprises a transmittance of greater than or equal to 65% throughout an electromagnetic radiation wavelength range of 300 nm to 1400 nm.

19. An article comprising:

a body comprising a material;

cupric oxide (CuO) in direct contact with the material of the body, the cupric oxide (CuO) comprising a thickness that is less than or equal to 1.0 nm;

an ultra-thin metal film comprising a metal disposed directly on the cupric oxide (CuO), the ultra-thin metal film further comprising a thickness within a range of 1 nm to 5 nm; and a second film comprising the same metal as the ultra-thin metal film disposed on the substrate but not contacting the ultra-thin metal film, the second film further comprising a thickness that is greater than the thickness of the ultra-thin metal film;

wherein, the article is at the ultra-thin metal film has a sheet resistance of less than or equal to $10^8$ $\Omega/\square$, as measured with a probe station connected to a multimeter using a four-point method at four different sets of positions on the ultra-thin metal film and then averaged.

20. The article of claim 19 further comprising:

a layer of an electrically conductive ionic gel contiguously disposed over both the ultra-thin metal film and the second film.

21. The article of claim 19, wherein the ultra-thin metal film comprises a contiguous perimeter and spaced ribbons extending between, and contiguous with, opposing sides of the contiguous perimeter.

22. The article of claim 1, wherein the material of the body comprises an alkaline earth aluminosilicate glass or a boroaluminosilicate glass.

23. The article of claim 6, wherein the sheet resistance of the article at the ultra-thin metal film is less than or equal to 2100 $\Omega/\square$.

24. The article of claim 7, wherein the sheet resistance of the article at the ultra-thin metal film is less than or equal to 2100 $\Omega/\square$.

25. The article of claim 19, wherein the sheet resistance of the article at the ultra-thin metal film is less than or equal to 2100 $\Omega/\square$.

26. The article of claim 19, wherein the material of the body is an alkaline earth aluminosilicate glass, a borosilicate glass, calcium fluoride ($CaF_2$), magnesium fluoride ($MgF_2$), fused quartz, doped fused silica, undoped fused silica, or combinations thereof.

27. The article of claim 19, wherein the thickness of the cupric oxide (CuO) is from 0.4 nm to 0.9 nm.

28. The article of claim 1, wherein the material of the body is an alkaline earth aluminosilicate glass or a borosilicate glass.

29. The article of claim 7, wherein the material of the body is an alkaline earth aluminosilicate glass, a borosilicate glass.

* * * * *